(12) United States Patent
Chen et al.

(10) Patent No.: US 9,640,247 B2
(45) Date of Patent: May 2, 2017

(54) METHODS AND APPARATUSES FOR GENERATING RANDOM NUMBERS BASED ON BIT CELL SETTLING TIME

(71) Applicant: QUALCOMM Incorporated, San Diego, CA (US)

(72) Inventors: Nan Chen, San Diego, CA (US); Junmou Zhang, San Diego, CA (US); Min Chen, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 263 days.

(21) Appl. No.: 14/597,146

(22) Filed: Jan. 14, 2015

(65) Prior Publication Data
US 2016/0202953 A1 Jul. 14, 2016

(51) Int. Cl.
G06F 7/58 (2006.01)
G11C 11/417 (2006.01)
G11C 7/10 (2006.01)

(52) U.S. Cl.
CPC ............ *G11C 11/417* (2013.01); *G06F 7/588* (2013.01); *G11C 7/1006* (2013.01)

(58) Field of Classification Search
CPC ................................ G06F 7/58; G11C 11/417
USPC ............................... 708/250–256, 3
See application file for complete search history.

(56) References Cited

U.S. PATENT DOCUMENTS

| | | | | |
|---|---|---|---|---|
| 4,176,399 A | * | 11/1979 | Hoffmann | ............ H04L 9/0662 708/250 |
| 6,070,178 A | * | 5/2000 | Anderson | ............... G06F 7/588 708/250 |
| 6,571,263 B1 | * | 5/2003 | Nagai | ................... H04L 9/0861 708/255 |
| 6,829,628 B2 | | 12/2004 | Kim | |
| 7,007,060 B2 | * | 2/2006 | Miller, Jr. | ................ H03K 3/84 708/255 |
| 7,702,701 B2 | * | 4/2010 | Kim | ....................... G06F 7/588 708/255 |
| 8,555,119 B2 | | 10/2013 | Chang | |

(Continued)

FOREIGN PATENT DOCUMENTS

WO WO-2014053286 A1 4/2014

OTHER PUBLICATIONS

Maes R., "Physically Unclonable Functions: Concept and Constructions," Chapter 2, Springer-Verlag Berlin Heidelberg, 2013, pp. 11-48.

(Continued)

*Primary Examiner* — Tan V. Mai
(74) *Attorney, Agent, or Firm* — Loza & Loza, LLP

(57) ABSTRACT

One feature pertains to a true random number generator that utilizes the settling time of a bit cell as an entropy source to generate random digital output values. The bit cell may be a static random access memory bit cell. The bit cell's settling time may be converted into a digital output using an analog to digital converter. A plurality of bit cells may serially couple to one another in a ring formation. The bit cell ring can then be enabled such that each bit cell of the plurality of bit cells achieves a settling value that activates the subsequent bit cell in the ring causing it to in turn reach a settling value, and so on. An output node of one of the bit cells in the ring can then be sampled using a flip-flop to generate a continuous stream of random bits.

48 Claims, 20 Drawing Sheets

(56) References Cited

U.S. PATENT DOCUMENTS

| | | | |
|---|---|---|---|
| 8,583,711 B2* | 11/2013 | Hars | G06F 7/588 708/255 |
| 8,880,954 B2 | 11/2014 | Gebara et al. | |
| 2012/0030268 A1* | 2/2012 | Liu | G06F 7/588 708/254 |
| 2015/0178048 A1* | 6/2015 | Burleson | G06F 7/588 708/255 |
| 2015/0193208 A1* | 7/2015 | Rooks | G06F 7/588 708/251 |

OTHER PUBLICATIONS

Epstein M., et al., "Design and Implementation of a True Random Number Generator Based on Digital Circuit Artifacts," Lecture Notes in Computer Science LNCS-Cryptographic Hardware and Embedded Systems—CHES 2003, Jan. 1, 2003 (Jan. 1, 2003), pp. 152-165, XP055042593, Retrieved from the Internet: URL:http://rd.springer.com/chapter/10.100792F978-3-540-45238-6 13?LI=true# [retrieved on 2012-1U-30].
International Search Report and Written Opinion—PCT/US2015/065627—ISA/EPO—Sep. 29, 2016.
Tokunaga C., et al.,"True Random Number Generator with a Metastability-Based Quality Control," 2007 IEEE International Solid-State Circuits Conference (IEEE Cat. No. 07CH37858), IEEE, Piscataway, NJ, USA, Feb. 1, 2007 (Feb. 1, 2007), pp. 404-611, XP031180143, ISBN: 978-1-4244-0852-8.
Varchola M, "FPGA Based True Random Number Generators for Embedded Cryptographic Applications," Dec. 1, 2008 (Dec. 1, 2008), XP055298209, Retrieved from the Internet: URL:http://www.varchola.com/embedded/src/pdf/minimovka.pdf [retrieved on Aug. 29, 2016] pp. 74-76.

\* cited by examiner

METHODS AND APPARATUSES FOR GENERATING RANDOM NUMBERS BASED ON BIT CELL SETTLING TIME

BACKGROUND

Field

Various features generally relate to random number generators, and more specifically to random number generators that utilize the settling time of one or more bit cells as an entropy source.

Background

As mobile electronic devices, such as portable telephone devices, laptops, tablets, integrated circuit (IC) cards, etc., are rapidly becoming more common, there is an increasing demand for high-level, robust cryptographic security systems that protect data in small-sized electronic circuits. Such cryptographic security systems may be broadly divided into public-key cryptography and symmetric-key cryptography. In public-key cryptography, different keys are used for the encryption and decryption of information. In such a system, security is ensured by keeping one key (e.g., private key) used for decrypting encrypted information secret at the recipient, while another key (e.g., public key) is made available to the public so that the sender can use it to encrypt the information before sending it to the recipient. By contrast, in symmetric-key cryptography a single key is used for the encryption and decryption of the information. In such a system, security is ensured by keeping the key secret from third parties (i.e., parties excluding the recipient and sender).

Thus, in both public-key and symmetric-key cryptographic systems, security is dependent upon the confidentiality of at least one secret key. If the secret key is accessible or calculable by a third party in some way, the security of the cryptographic system may break down. Accordingly, secret key generation should be executed using algorithms that make guessing or calculating the secret key by a third party practically infeasible. Such algorithms generally use random numbers—that are unknown to third parties—to generate the secret key.

Depending on how they are generated, random numbers are broadly divided into two groups: pseudo-random numbers and true random numbers.

Pseudo-random numbers refer to a part of a sequence of numbers generated by deterministic calculation, and are generated by feeding a seed to a pseudo-random number generation algorithm as an initial value. Pseudo-random numbers are logically predictable as long as its generation method (i.e., pseudo-random number generation algorithm) is known. Furthermore, if the seed is known then it becomes possible to generate the same pseudo-random sequence of numbers in advance. For this reason, the safety of encrypted information may be threatened when pseudo-random numbers are used to generate the secret key of the cryptographic system.

By contrast, true random numbers are generated by making use of physical phenomenon that has intrinsically random properties. Examples of such physical phenomenon include, for example, thermal noise in electronic devices, radioactive decay, arrival timing of network data, electrical noise, etc. Unlike pseudo-random numbers, true random numbers have no reproducibility, and thus such random numbers cannot be predicted. For this reason, cryptographic systems that utilize true random numbers to generate secret keys are more secure than those that utilize pseudo-random numbers.

One source of entropy for true random number generation is the initial state (i.e., power up state) of static random access memory (SRAM) cells, which in theory could be either a logical 1 or 0 with equal probability. Memory cells offer a convenient and economical means for providing entropy because they are so ubiquitous on integrated circuits. However, due to unavoidable device mismatches within an SRAM cell (e.g., one inverter has more pull/gain than the other inverter), such memory cells have a natural tendency to be biased to a specific logical value (e.g., 0 or 1) at startup and consequently the entropy they provide is lessened.

There is a need for on-chip entropy sources that are small and inexpensive, and that provide high entropy and randomness. Such entropy sources can be used by random number generators to generate true random numbers for use in a variety of applications including but not limited to cryptographic security algorithms (e.g., cryptographic key generation algorithms), gambling, statistical sampling, computer simulations, completely randomized designs, Monte Carlo-method simulations, and any other application that utilizes an unpredictable value.

SUMMARY

One feature provides a random number generator comprising a bit cell having a random settling time, and an analog to digital converter (ADC) configured to receive the random settling time and generate a random digital output value based on the random settling time. According to one aspect, the bit cell includes a six transistor (6T) complimentary metal-oxide semiconductor (CMOS) static random access memory (SRAM) cell portion. According to another aspect, the bit cell includes at least two pre-charge transistors configured to initialize differential output nodes of the bit cell to an initialization voltage value. According to yet another aspect, the two pre-charge transistors are configured to be turned OFF in order to cause the differential output nodes to transition from the initialization voltage value to a pre-charge voltage value $V_{PC}$.

According to one aspect, the initialization voltage value is either about a positive supply line voltage $V_{DD}$ or a negative supply line voltage $V_{SS}$, and the pre-charge voltage value $V_{PC}$ is $0.5*V_{DD} \pm 0.15*V_{DD}$. According to another aspect, after the differential output nodes transition to $V_{PC}$ they diverge from one another and settle at opposing settling values. According to yet another aspect, the ADC is a time to digital converter (TDC).

According to one aspect, the random number generator further comprises a plurality of bit cells each having a random settling time, the plurality of bit cells arranged in series such that an output of each of the plurality of bit cells is coupled to an input of a successive bit cell of the plurality of bit cells except a last bit cell of the plurality of bit cells has an output that does not couple to another bit cell. According to another aspect, a total random settling time is equal to a sum of each of the random settling times of the plurality of bit cells, and the ADC is configured to receive the total random settling time and generate the random digital output value based on the total random settling time. According to yet another aspect, the random number generator further comprises a plurality of bit cells each having a random settling time, the plurality of bit cells arranged in a ring such that an output of each of the plurality of bit cells is coupled to an input of a successive bit cell of the plurality of bit cells.

According to one aspect, a periodic random settling time is equal to a sum of each of the random settling times of the plurality of bit cells, and the ADC is configured to receive the periodic random settling time and generate the random digital output value based on the periodic random settling time. According to another aspect, at least one output of a bit cell of the plurality of bit cells is sampled at a sampling rate to generate a plurality of random digital output values. According to yet another aspect, the random number generator further comprises a flip-flop having an input coupled to the output being sampled, the flip-flop having a clock input at the sampling rate and configured to generate the plurality of random digital output values. According to yet another aspect, the random number generator further comprises a flip-flop having an input coupled to an output of a bit cell of the plurality of bit cells, an output of the flip-flop configured to generate the plurality of random digital output values, and the flip-flop having a clock input coupled to an output of a bit cell ring oscillator entropy source.

Another feature provides a random number generator comprising a bit cell ring oscillator including a plurality of bit cells arranged in a ring formation, and means for sampling an output node of a bit cell of the plurality of bit cells to generate a plurality of random bits. According to one aspect, at least one output node of each of the bit cells of the bit cell ring oscillator are configured to transition from an initialization value to a settling value, a settling value of a preceding bit cell causing the output node of a subsequent bit cell to transition from an initialization value to a settling value. According to another aspect, at least one output node of each of the bit cells of the bit cell ring oscillator are configured to transition from a settling value to an initialization value, a settling value of a preceding bit cell causing the output node of a subsequent bit cell to transition from a settling value to an initialization value. According to yet another aspect, the bit cell ring oscillator has a random periodic settling time $t_{settle\_period}$ that is based on the settling time $t_{settle}$ of each of the plurality of bit cells, and the plurality of random bits are randomly generated based, in part, on the random periodic settling time $t_{settle\_period}$.

According to one aspect, the plurality of bit cells are configured to alternate between phases of initialization and activation. According to another aspect, the means for sampling is a flip-flop having an input communicatively coupled to the output node of the bit cell and an output that generates the random bits by latching a bit value at the input to the output of the flip-flop, the flip-flop sampling the output node of the bit cell based on a clock signal supplied by a clock to the flip-flop. According to yet another aspect, the plurality of bit cells of the bit cell ring oscillator includes a first bit cell and a last bit cell, an output of the last bit cell communicatively coupled to an input of the first bit cell, and inputting a bit value to the input of the first bit cell generates an output bit value at the output of the last bit cell that is opposite the bit value inputted to the input of the first bit cell.

According to one aspect, the random number generator includes 4*n−2 bit cells and n is a positive integer greater than or equal to one (1). According to another aspect, at least one bit cell of the plurality of bit cells is a p-type bit cell that includes a p-channel metal-oxide-semiconductor field-effect-transistor (PMOS) enable transistor, a cross-coupled inverter pair, and two n-channel metal-oxide-semiconductor field-effect-transistor (NMOS) pre-charge transistors, the cross-coupled inverter pair having two complimentary output nodes that are communicatively coupled to inputs of at least one of an XOR gate and/or an XNOR gate, and an output of the XOR gate and/or the XNOR gate is the output node of the bit cell sampled by the means for sampling. According to yet another aspect, at least one bit cell of the plurality of bit cells is an n-type bit cell that includes an NMOS enable transistor, a cross-coupled inverter pair, and two PMOS pre-charge transistors, the cross-coupled inverter pair having two complimentary output nodes that are communicatively coupled to inputs of at least one of an XOR gate and/or an XNOR gate, and an output of the XOR gate and/or the XNOR gate is the output node of the bit cell sampled by the means for sampling.

According to one aspect, a first bit cell of the plurality of bit cells is a p-type bit cell that includes a PMOS enable transistor, a first cross-coupled inverter pair, and two NMOS pre-charge transistors, the first cross-coupled inverter pair having two complimentary output nodes that are communicatively coupled to inputs of at least one of a first XOR gate and/or a first XNOR gate, a second bit cell of the plurality of bit cells is an n-type bit cell that includes an NMOS enable transistor, a second cross-coupled inverter pair, and two PMOS pre-charge transistors, the second cross-coupled inverter pair having two complimentary output nodes that are communicatively coupled to inputs of at least one of a second XOR gate and/or a second XNOR gate, and an output of the first XOR gate and/or the first XNOR gate is communicatively coupled to a gate of the NMOS enable transistor and gates of the two PMOS pre-charge transistors. According to another aspect, a delay element delays the output of the first XOR gate and/or the first XNOR gate to the gates of the two PMOS pre-charge transistors relative to the gate of the NMOS enable transistor.

According to one aspect, a first bit cell of the plurality of bit cells is a p-type bit cell that includes a first PMOS enable transistor, a first cross-coupled inverter pair, and two first NMOS pre-charge transistors, the first cross-coupled inverter pair having two complimentary output nodes that are communicatively coupled to inputs of an XOR gate, a second bit cell of the plurality of bit cells is a p-type bit cell that includes a second PMOS enable transistor, a second cross-coupled inverter pair, and two second NMOS pre-charge transistors, the second cross-coupled inverter pair having two complimentary output nodes that are communicatively coupled to inputs of an XNOR gate, and an output of the XOR gate is communicatively coupled to a gate of the second PMOS enable transistor and gates of the two second NMOS pre-charge transistors.

According to another aspect, a first bit cell of the plurality of bit cells is an n-type bit cell that includes a first NMOS enable transistor, a first cross-coupled inverter pair, and two first PMOS pre-charge transistors, the first cross-coupled inverter pair having two complimentary output nodes that are communicatively coupled to inputs of an XOR gate, a second bit cell of the plurality of bit cells is an n-type bit cell that includes a second NMOS enable transistor, a second cross-coupled inverter pair, and two second PMOS pre-charge transistors, the second cross-coupled inverter pair having two complimentary output nodes that are communicatively coupled to inputs of an XNOR gate, and an output of the XOR gate is communicatively coupled to a gate of the second NMOS enable transistor and gates of the two second PMOS pre-charge transistors. According to yet another aspect, the random number generator further comprises a plurality of bit cell ring oscillators each including a plurality of bit cells arranged in a ring formation, the plurality of bit cell ring oscillators each having an output that is inputted into a gate stage, the gate stage having a plurality of gates, the gate stage having a gate stage output that is sampled to generate the plurality of random bits.

Another feature provides a method of generating random numbers comprising determining a random settling time of a bit cell, and generating a random digital output value based on the random settling time of the bit cell using an analog to digital converter (ADC). According to one aspect, determining the random settling time of the bit cell includes initializing the bit cell to cause an output of the bit cell to be at an initialization voltage value, and activating the bit cell to transition the output of the bit cell from the initialization voltage value to a pre-charge voltage value and then to a settling voltage value. According to another aspect, the random settling time of the bit cell is a duration of time elapsed from when the bit cell is activated to when the output of the bit cell reaches the settling value.

According to one aspect, the method further comprises coupling a plurality of bit cells in a ring formation such that an output of each of the plurality of bit cells is coupled to an input of a successive bit cell of the plurality of bit cells, and each bit cell of the plurality of bit cells has a random settling time. According to another aspect, a periodic random settling time is equal to a sum of each of the random settling times of the plurality of bit cells, and the method further comprises generating the random digital output value based on the periodic random settling time using the ADC. According to yet another aspect, the method further comprises sampling at least one output of a bit cell of the plurality of bit cells at a sampling rate to generate a plurality of random digital output values.

According to one aspect, the method further comprises coupling an input of a flip-flop to an output of a bit cell of the plurality of bit cells, coupling a clock input of the flip-flop to an output of a bit cell ring oscillator, and generating a plurality of random digital output values at an output of the flip-flop. According to another aspect, the method further comprises coupling an input of a flip-flop to the output of the bit cell being sampled, providing a clock signal having the sampling rate to the flip-flop, and generating the plurality of random digital output values at an output of the flip-flop.

Another feature provides a computing device comprising a memory circuit, and a random number generator communicatively coupled to the memory circuit, the random number generator including a bit cell having a random settling time, and an analog to digital converter (ADC) configured to receive the random settling time and generate a random digital output value based on the random settling time, the random digital output value stored at the memory circuit. According to one aspect, the computing device's random number generator further includes a plurality of bit cells each having a random settling time, the plurality of bit cells arranged in a ring such that an output of each of the plurality of bit cells is coupled to an input of a successive bit cell of the plurality of bit cells. According to another aspect, the computing device's random number generator further includes a flip-flop having an input coupled to an output of a bit cell of the plurality of bit cells, an output of the flip-flop configured to generate a plurality of random digital output values, the flip-flop having a clock input coupled to an output of a bit cell ring oscillator entropy source, the plurality of random digital output values stored at the memory circuit.

Another feature provides a computing device comprising means for determining a random settling time of a bit cell, and means for generating a random digital output value based on the random settling time of the bit cell. According to one aspect, the means for determining the random settling time of the bit cell includes means for initializing the bit cell to cause an output of the bit cell to be at an initialization voltage value, and means for activating the bit cell to transition the output of the bit cell from the initialization voltage value to a pre-charge voltage value and then to a settling voltage value. According to another aspect, the computing device further comprises a plurality of bit cells coupled in a ring formation such that an output of each of the plurality of bit cells is coupled to an input of a successive bit cell of the plurality of bit cells, and each bit cell of the plurality of bit cells has a random settling time.

According to one aspect, a periodic random settling time is equal to a sum of each of the random settling times of the plurality of bit cells, and the computing device further comprises means for generating the random digital output value based on the periodic random settling time. According to another aspect, the computing device further comprises means for sampling at least one output of a bit cell of the plurality of bit cells at a sampling rate to generate a plurality of random digital output values.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits and structures may be shown in block diagrams in order to avoid obscuring the aspects in unnecessary detail. In other instances, well-known circuits, structures and techniques may not be shown in detail in order not to obscure the aspects of the disclosure. The word "exemplary" is used herein to mean "serving as an example, instance, or illustration." Any implementation or aspect described herein as "exemplary" is not necessarily to be construed as preferred or advantageous over other aspects of the disclosure. As used herein, "bit cell" refers to the part of an integrated circuit (IC) in which a single bit is stored.

Overview

The methods and apparatuses described herein pertain to true random number generators and true random number generation techniques that utilize the settling time of a bit cell as an entropy source to generate random numbers. The bit cell may be a static random access memory (SRAM) bit cell. The bit cell's settling time may then be converted into a digital output using an analog to digital converter (ADC) and/or a time to digital converter (TDC). A plurality of bit cells may serially couple to one another in a ring formation with the output of a first bit cell coupled to the input of a second bit cell, and so on, until the output of the last bit cell is coupled to the input of the first bit cell. The bit cell ring can then be enabled such that each bit cell of the plurality of bit cells achieves a settling value that activates the subsequent bit cell in the ring causing it to in turn reach a settling value, and so on. An output node of one of the bit cells in the ring can then be sampled using a flip-flop to generate a continuous stream of random bits.

Exemplary Apparatuses and Methods for True Random Number Generation

Figure 1:
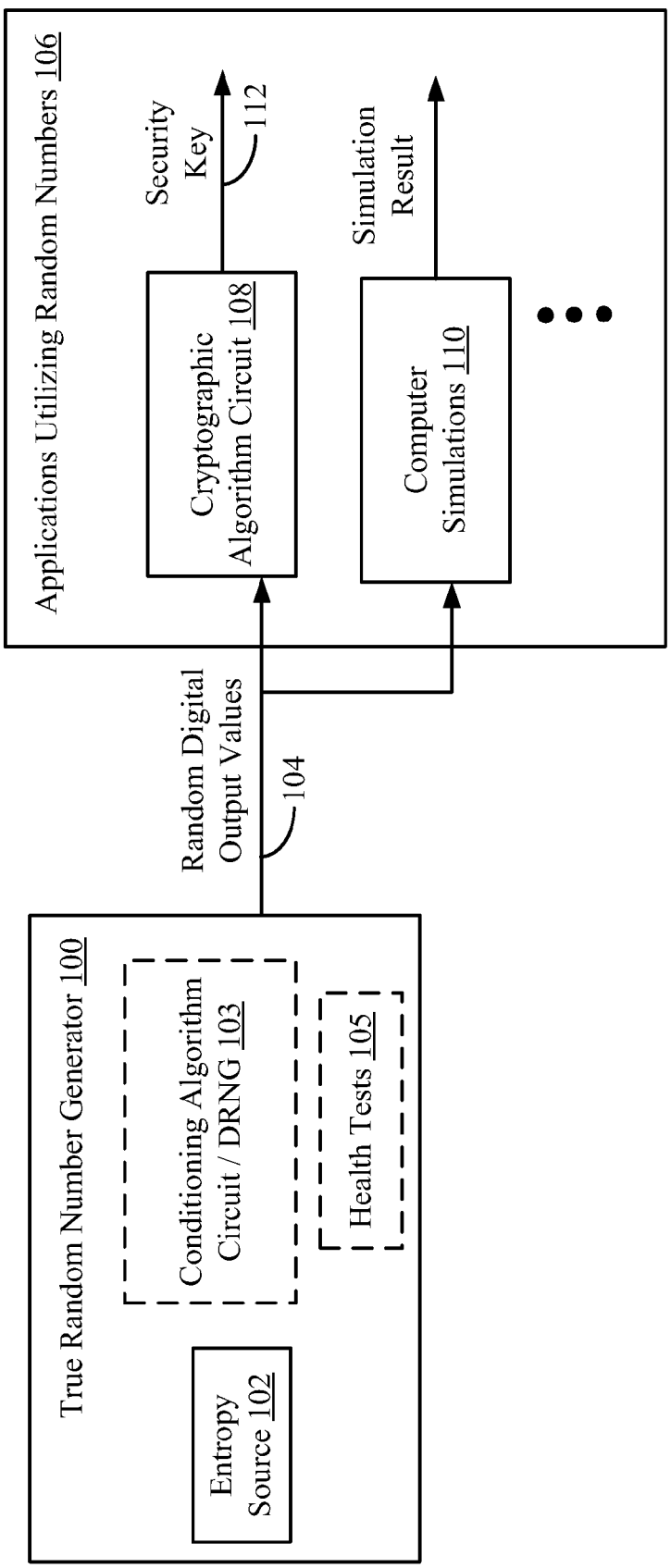
FIG. 1 illustrates a high-level schematic block diagram of a true random number generator.

FIG. 1 illustrates a high-level schematic block diagram of a true random number generator 100 according to one aspect of the disclosure. The random number generator 100 includes an on-chip bit cell entropy source 102, and may optionally include conditioning algorithm circuits (e.g., deterministic random number generator) 103 and/or health test circuits 105. The random number generator 100 generates random digital output values 104 (herein may also be referred to as "random number bitstring," "true random numbers," "true random bits", "plurality of random bits" etc.) that may be, for example, a truly random logical bitstring that lacks any discernable pattern. The random digital output values 104 may be utilized by a variety of applications 106 including but not limited to cryptographic security algorithms (e.g., cryptographic key generation algorithms) 108, gambling, statistical sampling, computer simulations 110, completely randomized designs, Monte Carlo-method simulations, and any other application that utilizes unpredictable values. For example, when utilized by a cryptographic security algorithm 108, such as Advanced Encryption Standard (AES), Data Encryption Standard (DES), Riverst, Shamir, Adleman (RSA), and Digital Signal Algorithm (DSA), the random digital output values 104 may be used to generate one or more security keys 112.

As described in greater detail below, the entropy source 102 is based on physical hardware elements that provide a very high degree of entropy. Specifically, the entropy source 102 is based on the settling time(s) of one or more bit cells. The optional conditioning algorithm circuit 103 consists of one or more algorithms that help reduce and/or eliminate any bias that may be present within the entropy source 102. The conditioning algorithm circuit 103 generally increases the entropy of the random digital output values 104. Such conditioning algorithms 103 are known to one of ordinary skill in the art. Health tests 105 may also be performed at the true random number generator 100 to determine whether the entropy source 102 and/or the true random number generator 100 is outputting a bit string with sufficient entropy.

Figure 2:
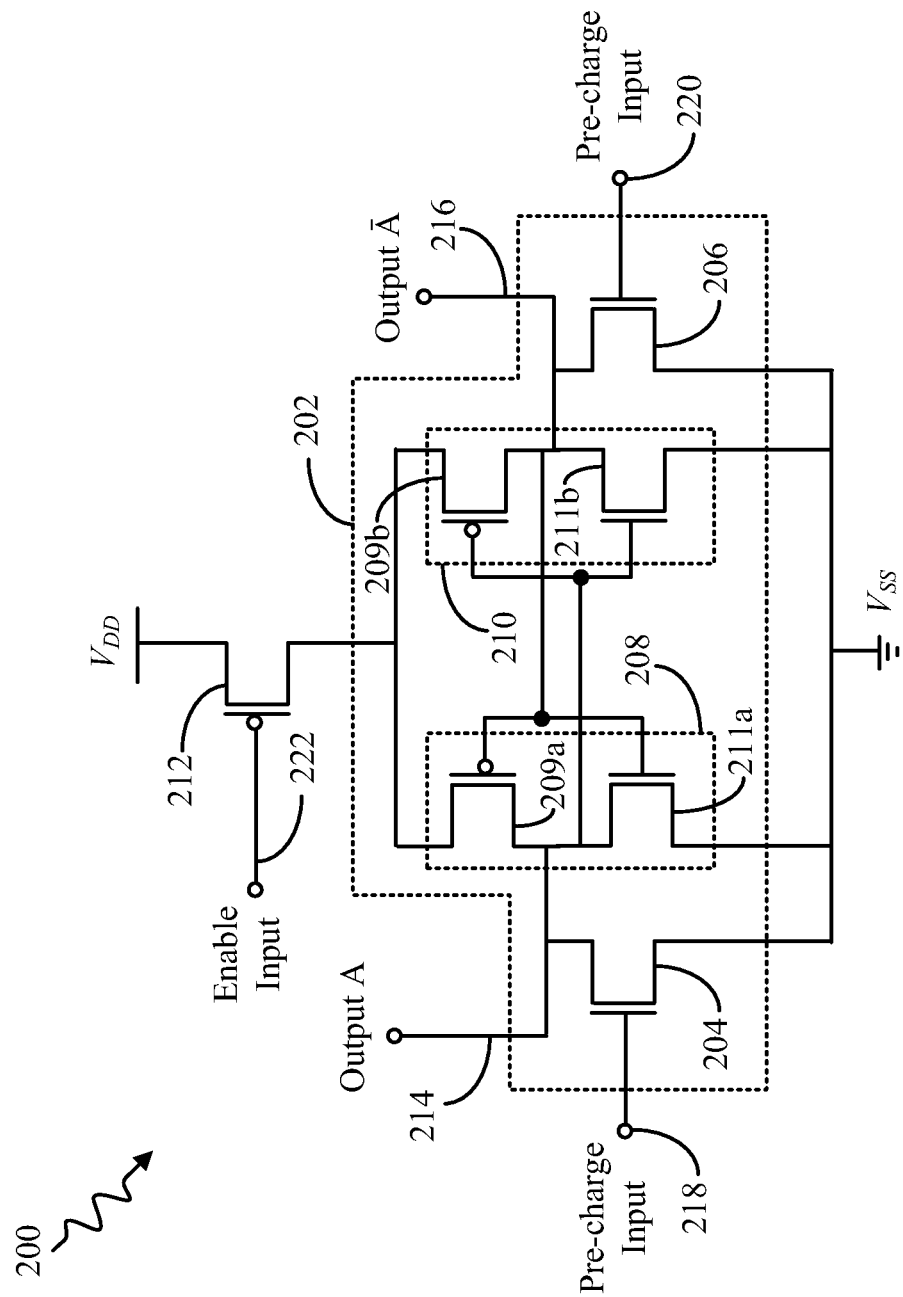
FIG. 2 illustrates a first exemplary bit cell that is an entropy source of a true random number generator.

FIG. 2 illustrates a first exemplary bit cell 200 that is the entropy source 102 of the true random number generator 100 according to one aspect of the disclosure. The bit cell 200 may be based on any static random access memory (SRAM) bit cell design. In the illustrated example, the bit cell 200 shown includes a six (6) transistor cell portion 202 that is based on a six transistor (6T) complimentary metal-oxide semiconductor (CMOS) SRAM bit cell design. The six transistor portion 202 includes a first pre-charge transistor 204, a second pre-charge transistor 206, a first CMOS inverter pair 208, and a second CMOS inverter pair 210. The bit cell 200 also includes an enable transistor 212. The first and second inverter pairs 208, 210 each include a p-channel metal-oxide-semiconductor field-effect-transistor (PMOS) transistor 209a, 209b and an n-channel metal-oxide-semiconductor field-effect-transistor (NMOS) transistor 211a, 211b. In the example shown in FIG. 2, the enable transistor 212 is PMOS (and the pre-charge transistors are NMOS). Consequently, such a design is herein referred to as a "p-type bit cell."

The bit cell 200 based entropy source utilizes the random settling time of the bit cell 200 as its source of entropy. The amount of time it takes for the bit cell 200 output values 214, 216 to settle to stable logical values after bit cell 200 activation or bit cell 200 pre-charge provides entropy to the random number generator 100. The settling time is random due to thermal and electrical noise of the bit cell 200.

Figure 3:
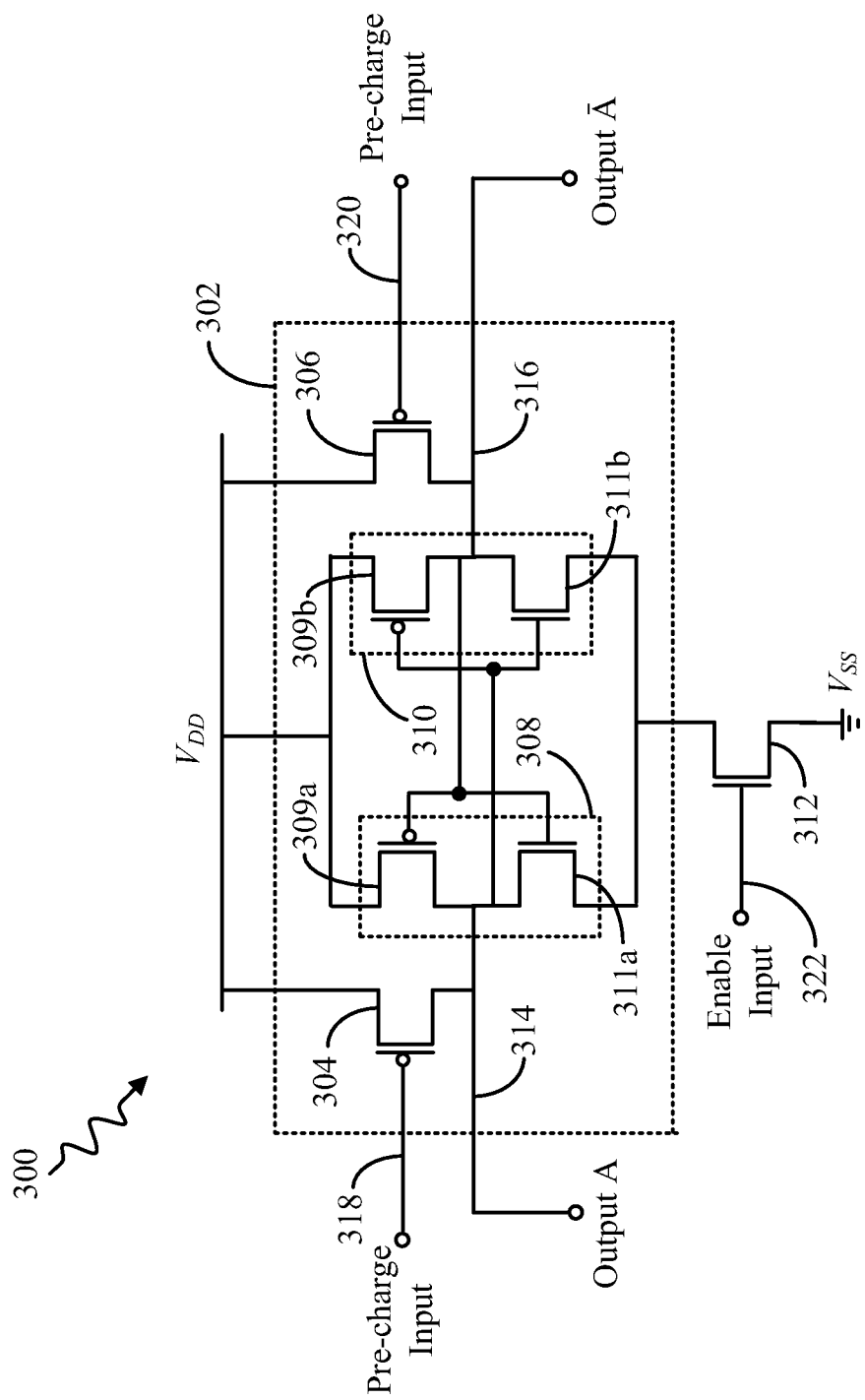
FIG. 3 illustrates a second exemplary bit cell that is an entropy source of a true random number generator.

FIG. 3 illustrates a second exemplary bit cell 300 that is the entropy source 102 of the true random number generator 100 according to one aspect of the disclosure. The bit cell 300 shown also includes a six (6) transistor cell portion 302 that is based on a 6T CMOS SRAM bit cell design. The six transistor portion 302 includes a first pre-charge transistor 304, a second pre-charge transistor 306, a first CMOS inverter pair 308, and a second CMOS inverter pair 310. The bit cell 300 also includes an enable transistor 312. The first and second inverter pairs 308, 310 each include a PMOS transistor 309a, 309b and an NMOS transistor 311a, 311b. In the example shown in FIG. 3, the enable transistor 312 is NMOS (and the pre-charge transistors are PMOS). Consequently, such a design is herein referred to as an "n-type bit cell."

The bit cell 300 based entropy source utilizes the random settling time of the bit cell 300 as its source of entropy. The amount of time it takes for the bit cell 300 output values 314, 316 to settle to stable logical values after bit cell 300 activation or bit cell 300 pre-charge provides entropy to the random number generator 100. The settling time is random due to thermal and electrical noise of the bit cell 300.

The bit cells 200, 300 shown in FIGS. 2 and 3 are based on a six transistor CMOS SRAM bit cell. However, other types of bit cells may also be used including but not limited to the four transistor (4T) CMOS SRAM bit cells shown in FIGS. 6 and 7.

Figure 4:
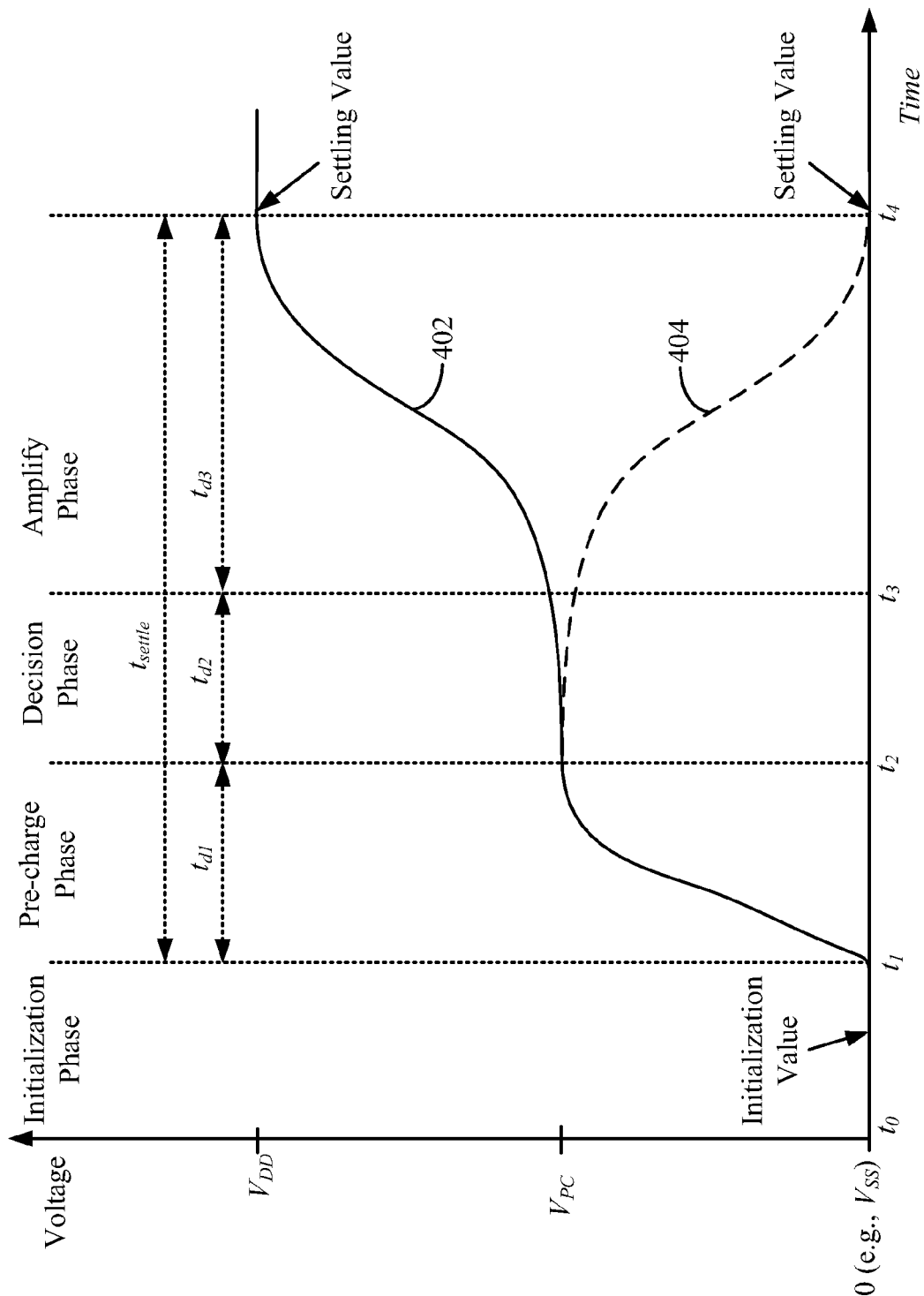
FIG. 4 illustrates a timing diagram of a p-type bit cell.

FIG. 4 illustrates a timing diagram 400 of the p-type bit cell 200 according to one aspect. A first line 402 represents the voltage value of output A 214 and a second line 404 (dashed line) represents the voltage value of complimentary output $\overline{A}$ 216 versus time as the bit cell 200 undergoes different phases including pre-charging and activation.

Referring to FIGS. 2 and 4, during the initialization phase (e.g., at time $t_0$), the pre-charge transistors 204, 206 are turned ON and the enable transistor 212 is turned OFF, for example, by applying the positive supply line voltage (e.g., $V_{DD}$) to the pre-charge inputs 218, 220 and the enable input 222. At this stage the output A voltage level 402 and the output $\overline{A}$ voltage level 404 are both at their initialization values, which in the illustrated case is about the negative supply line voltage $V_{SS}$ (e.g., ground) since the output nodes 214, 216 are coupled to the negative supply line voltage $V_{SS}$.

Then during a pre-charge phase, the bit cell 200 is activated and the pre-charge transistors 204, 206 are turned OFF and the enable transistor 212 turned ON (e.g., at time $t_1$) by, for example, applying the negative supply line voltage $V_{SS}$ to the pre-charge inputs 218, 220 and the enable input 222. Turning OFF the pre-charge transistors 204, 206 and turning ON the enable transistor 212 causes the output nodes' voltage levels 402, 404 to transition from the initialization value (e.g., rise from the negative supply line voltage $V_{SS}$) at time $t_1$ to a pre-charge voltage value $V_{PC}$ at time $t_2$. The pre-charge voltage value $V_{PC}$ represents the voltage value that the output nodes 214, 216 will reach together until the inverters 208, 210 achieve a high gain state with both their PMOS transistors 209a, 209b and NMOS transistors 211a, 211b in the saturation region and before the output nodes' 214, 216 voltage values begin to diverge. According to some non-limiting, non-exclusive examples the pre-charge voltage value $V_{PC}$ may be about: $0.5*V_{DD} \pm 0.05*V_{DD}$; $0.5*V_{DD} \pm 0.10*V_{DD}$; or $0.5*V_{DD} \pm 0.15*V_{DD}$. The time it takes for the output nodes' voltage levels 402, 404 to pre-charge to $V_{PC}$ (i.e., the pre-charge phase time duration) is represented by $t_{D1}$ (i.e., $t_2-t_1$).

Next during the decision phase, thermal and/or electrical noise along with any inverter 208, 210 bias within the bit cell 200 causes the output voltage levels 402, 404 to begin drifting away from $V_{PC}$ in opposite directions. At some point in time $t_3$ the output voltage levels 402, 404 have drifted away from each other to such a degree that it is highly improbable that they will reverse course. The time it takes for the output node voltage levels 402, 404 to reach this point after achieving $V_{PC}$ (i.e., the decision phase time duration) is represented by $t_{D2}$ (e.g., $t_3-t_2$).

Then during the amplify phase, the output voltage values 402, 404 continue to diverge from one another as the bit cell's 200 inverters 208, 210 amplify the output voltage levels 402, 404 to the settling values (e.g., about full swing). In the example shown, output A's voltage level 402 is amplified to about $V_{DD}$ and output $\overline{A}$'s voltage level 404 is amplified to about the negative supply line voltage $V_{SS}$. The time it takes for the amplify phase to complete is represented by $t_{D3}$ (e.g., $t_4-t_3$). Although the example illustrated in FIG. 4 shows output A 402 amplified to $V_{DD}$ (i.e., output A is logical 1) and output $\overline{A}$ 404 amplified to the negative supply line voltage $V_{SS}$ (i.e., output $\overline{A}$ is logical 0), the two outputs 402, 404 may be reversed such that output A 402 is amplified to the negative supply line voltage $V_{SS}$ (i.e., output A is logical 0) and output $\overline{A}$ 404 is amplified to $V_{DD}$ (i.e., output $\overline{A}$ is logical 1).

According to one aspect, the time elapsed from the moment the pre-charge transistors 204, 206 are turned OFF (i.e., time $t_1$) to the point at which the output node A and $\overline{A}$ voltage values 402, 404 have reached the settling values (i.e., time $t_4$) such as the full swing (i.e., $V_{DD}$ and $V_{SS}$) values or within some percentage of the full swing values (e.g., $8*V_{DD}$ and $0.2*V_{DD}$, $0.9*V_{DD}$ and $0.1*V_{DD}$, $0.95*V_{DD}$ and $0.05*V_{DD}$, etc.) may be the random settling time $t_{settle}$ of the bit cell 200, and is given by equation (1):

$$t_{settle} = t_{D1} + t_{D2} t_{D3} \qquad (1).$$

According to another aspect, the random settling time $t_{settle}$ may be the time elapsed from when the bit cell's output nodes 214, 216 are at $V_{PC}$ (i.e., time $t_2$) to the point at which the output node A and $\overline{A}$ voltage values 402, 404 have reached their settling values (i.e., time $t_4$) such as the full swing values or within some percentage of the full swing values. That is, $t_{settle}$ may be given by equation (2):

$$t_{settle} = t_{D2} t_{D3} \qquad (2).$$

The random settling time value $t_{settle}$ is random and different, however slight, each and every time the bit cell 200 is activated (i.e., pre-charge transistors 204, 206 are turned OFF and bit cell begins to pre-charge) because the amount of time the bit cell 200 spends in the decision and amplification stages (i.e., $t_{D2}$ and $t_{D3}$) randomly varies from one activation event to another. Moreover, the randomness of the bit cell's settling time $t_{settle}$ is not lessened due to transistor mismatch and/or invertor 208, 210 bias. Thus, regardless of whether the bit cell 200 is biased to settle at a specific logical value (e.g., 0 or 1) the settling time $t_{settle}$ it takes to reach that logical value is random. Consequently, the settling time $t_{settle}$ of the bit cell 200 provides an excellent entropy source for the random number generator 100.

Figure 5:
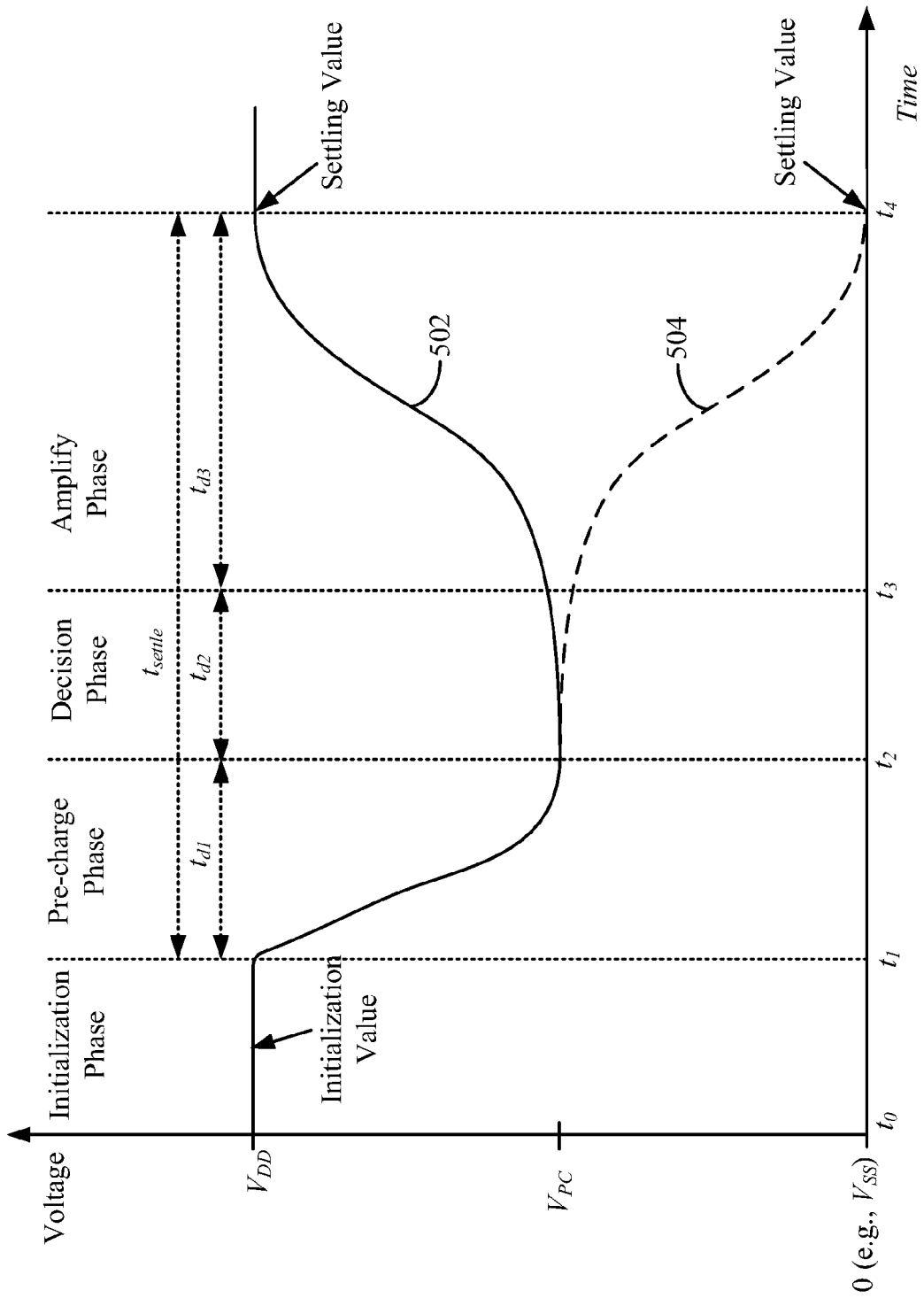
FIG. 5 illustrates a timing diagram of an n-type bit cell.

FIG. 5 illustrates a timing diagram 500 of the n-type bit cell 300 according to one aspect. A first line 502 represents the voltage value of output A 314 and a second line 504 (dashed line) represents the voltage value of complimentary output $\overline{A}$ 316 versus time as the bit cell 300 undergoes different phases including pre-charging and enabling.

Referring to FIGS. 3 and 5, during the initialization phase (e.g., at time $t_0$), the pre-charge transistors 304, 306 are turned ON and the enable transistor 312 turned OFF by, for example, applying the negative supply line voltage (e.g., $V_{SS}$) to the pre-charge inputs 318, 320 and the enable input 322. At this stage the output A voltage level 502 and the output $\overline{A}$ voltage level 504 are both at their initialization values, which in the illustrated case is about the positive supply line voltage $V_{DD}$ since the output nodes 314, 316 are coupled to the positive supply line voltage $V_{DD}$.

Then during a pre-charge phase, the bit cell 300 is activated and the pre-charge transistors 304, 306 are turned OFF and the enable transistor 312 is turned ON (e.g., at time $t_1$) by, for example, applying the negative supply line voltage $V_{SS}$ to the pre-charge inputs 318, 320 and the enable input 322. Turning OFF the pre-charge transistors 304, 306 and turning ON the enable transistor 312 causes the output nodes' voltage levels 502, 504 to transition from the initialization value (e.g., fall from the positive supply line voltage $V_{DD}$) at time $t_1$ to a pre-charge voltage value $V_{PC}$ at time $t_2$. The pre-charge voltage value $V_{PC}$ represents the voltage value that the output nodes 314, 316 will reach together until the inverters 308, 310 achieve a high gain state with both their PMOS transistors 309a, 309b and NMOS transistors 311a, 311b in the saturation region and before the output nodes' 314, 316 voltage values begin to diverge. According to some non-limiting, non-exclusive examples the pre-charge voltage value $V_{PC}$ may be about: $0.5^*V_{DD} \pm 0.05^*V_{DD}$; $0.5^*V_{DD} \pm 0.10^*V_{DD}$; or $0.5^*V_{DD} \pm 0.15^*V_{DD}$. The time it takes for the output nodes' voltage levels 502, 504 to pre-charge to $V_{PC}$ (i.e., the pre-charge phase time duration) is represented by $t_{D1}$ (i.e., $t_2-t_1$).

Next during the decision phase, thermal and/or electrical noise along with any inverter 308, 310 bias within the bit cell 300 causes the output voltage levels 502, 504 to begin drifting away from $V_{PC}$ in opposite directions. At some point in time $t_3$ the output voltage levels 502, 504 have drifted away from each other to such a degree that it is highly improbable that they will reverse course. The time it takes for the output node voltage levels 502, 504 to reach this point after achieving $V_{PC}$ (i.e., the decision phase time duration) is represented by $t_{D2}$ (e.g., $t_3-t_2$).

Then during the amplify phase, the output voltage values 502, 504 continue to diverge from one another as the bit cell's 300 inverters 308, 310 amplify the output voltage levels 502, 504 to their settling values (e.g., about full swing voltage). In the example shown, output A's voltage level 502 is amplified to about $V_{DD}$ and output $\overline{A}$'s voltage level 504 is amplified to about the negative supply line voltage $V_{SS}$. The time it takes for the amplify phase to complete is represented by $t_{D3}$ (e.g., $t_4-t_3$). Although the example illustrated in FIG. 5 shows output A 502 amplified to $V_{DD}$ (i.e., output A is logical 1) and output $\overline{A}$ 504 amplified to the negative supply line voltage $V_{SS}$ (i.e., output $\overline{A}$ is logical 0), the two outputs 502, 504 may be reversed such that output A 502 is amplified to the negative supply line voltage $V_{SS}$ (i.e., output A is logical 0) and output $\overline{A}$ 504 is amplified to $V_{DD}$ (i.e., output $\overline{A}$ is logical 1).

According to one aspect, the time elapsed from the moment the pre-charge transistors 304, 306 are turned OFF (i.e., time $t_1$) to the point at which the output node A and $\overline{A}$ voltage values 502, 504 reach their settling values (i.e., time $t_4$) such as the full swing values or within some percentage of the full swing values (e.g., $8^*V_{DD}$ and $0.2^*V_{DD}$, $0.9^*V_{DD}$ and $0.1^*V_{DD}$, $0.95^*V_{DD}$ and $0.05^*V_{DD}$, etc.) may be the random settling time $t_{settle}$ of the bit cell 300, and is given by equation (3):

$$t_{settle} = t_{D1} + t_{D2} + t_{D3} \quad (3).$$

According to another aspect, the random settling time $t_{settle}$ may be the time elapsed from when the bit cell's output nodes 314, 316 are at $V_{PC}$ (i.e., time $t_2$) to the point at which the output node A and $\overline{A}$ voltage values 502, 504 have reached their settling values (i.e., time $t_4$) such as the full swing values or within some percentage of the full swing values. That is, $t_{settle}$ may be given by equation (4):

$$t_{settle} = t_{D2} + t_{D3} \quad (4).$$

The random settling time value $t_{settle}$ is random and different, however slight, each and every time the bit cell 300 is activated (i.e., pre-charge transistors 304, 306 are turned OFF and bit cell begins to pre-charge) because the amount of time the bit cell 300 spends in the decision and amplification stages randomly varies from one activation event to another. Moreover, the randomness of the bit cell's settling time $t_{settle}$ is not lessened due to transistor mismatch and/or inverter 308, 310 bias. Thus, regardless of whether the bit cell 300 is biased to settle at a specific logical value (e.g., 0 or 1) the settling time $t_{settle}$ it takes to reach that logical value is random. Consequently, the settling time $t_{settle}$ of the bit cell 300 provides an excellent entropy source for the random number generator 100.

Figure 6:
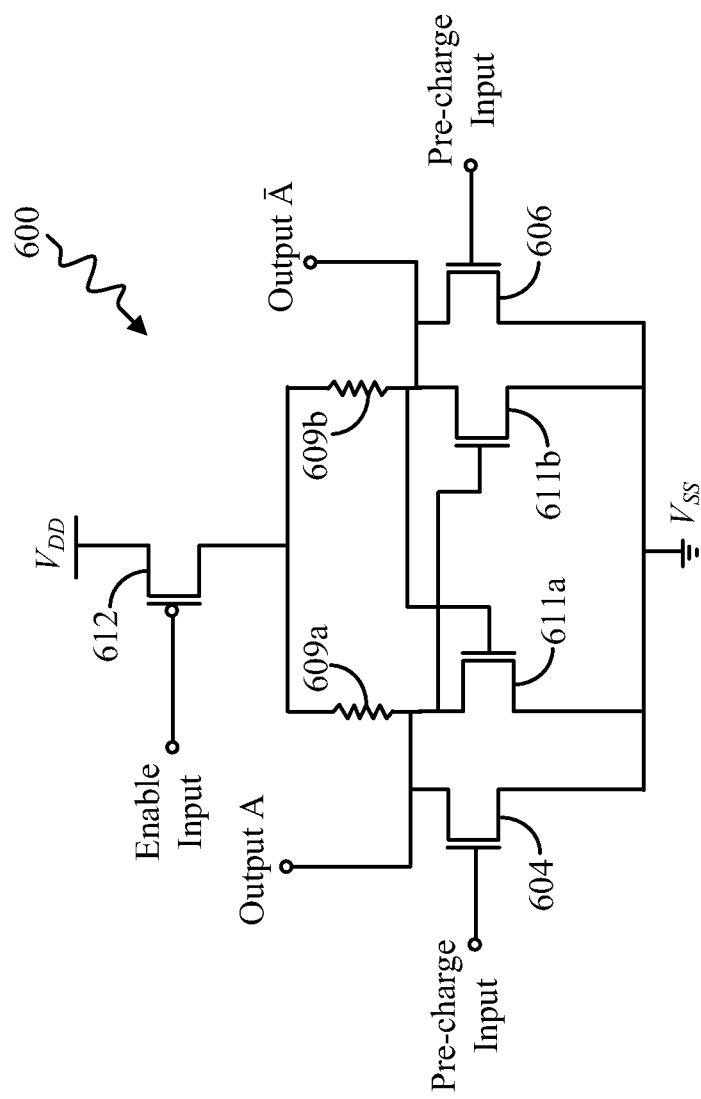
FIG. 6 illustrates a first exemplary bit cell based on a four transistor (4T) CMOS SRAM design.
Figure 7:
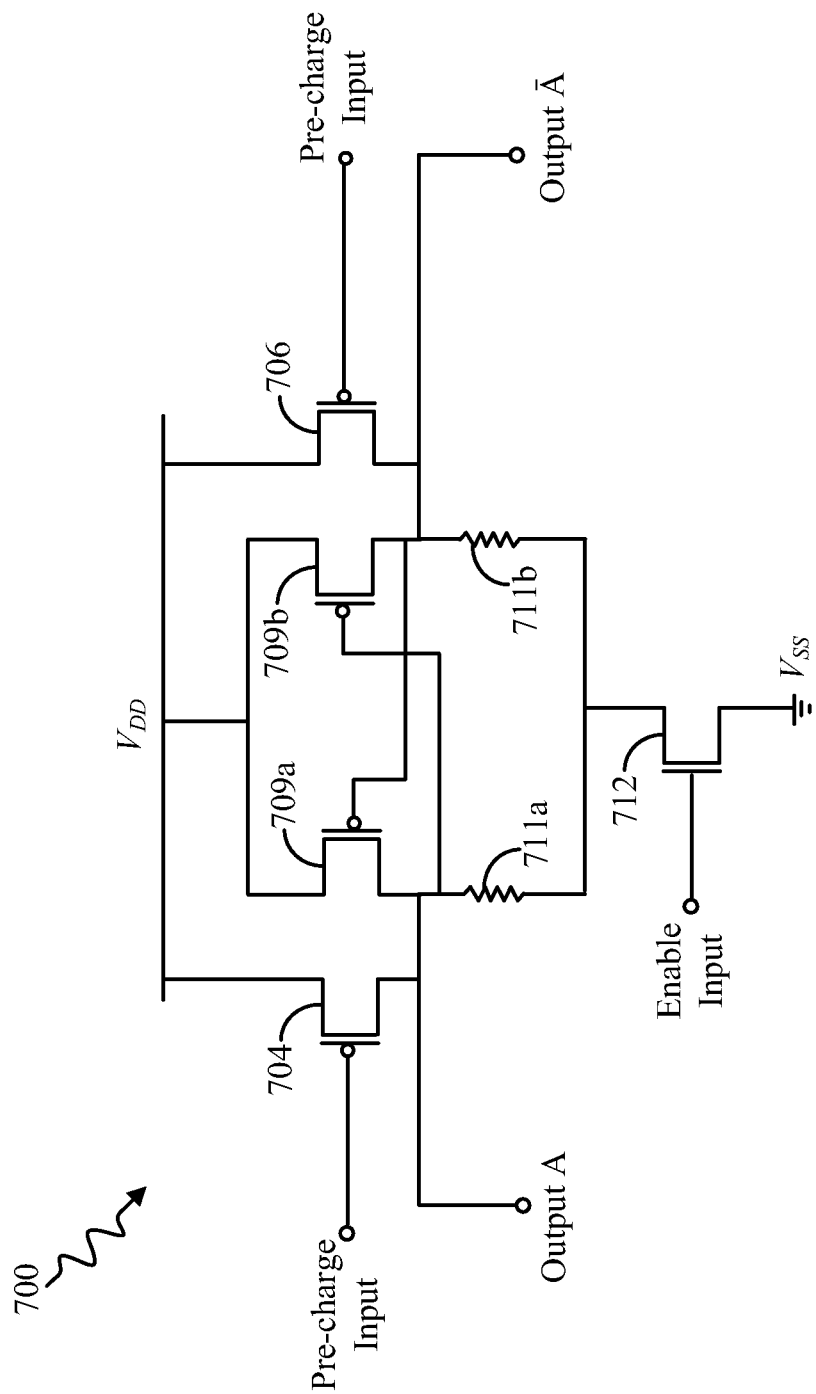
FIG. 7 illustrates a second exemplary bit cell based on a four transistor (4T) CMOS SRAM design.

As mentioned above, FIGS. 6 and 7 illustrate bit cells 600, 700 based on a four transistor (4T) CMOS SRAM design. Specifically, the bit cell 600 shown in FIG. 6 is a p-type bit cell and the bit cell 700 shown in FIG. 7 is an n-type bit cell. Referring to FIG. 6, the p-type 4T bit cell 600 includes a first pre-charge NMOS transistor 604, a second pre-charge NMOS transistor 606, a first inverter comprising a first pull-up resistor 609a and a first NMOS transistor 611a, a second inverter comprising a second pull-up resistor 609b and a second NMOS transistor 611b, and an enable NMOS transistor 612.

Referring to FIG. 7, the n-type 4T bit cell 700 includes a first pre-charge PMOS transistor 704, a second pre-charge PMOS transistor 706, a first inverter comprising a first PMOS transistor 709a and a first pull-down resistor 711a, a second inverter comprising a second PMOS transistor 709b and a second pull-down resistor 711b, and an enable PMOS transistor 712.

The random number generator 100 may utilize the bit cells 600, 700 shown in FIGS. 6 and 7 in generally the same way as the bit cells 200, 300 shown in FIGS. 2 and 3 in that the settling time of the bit cells 600, 700 in FIGS. 6 and 7 may be used as an entropy source 102.

These bit cells 200, 300, 600, 700 are merely some examples of SRAM based bit cells whose settling times may be used as entropy sources. Other SRAM based bit cells having different transistor configurations may also be used to provide random settling times that can be used as entropy sources for random number generators. In one aspect, bit cells of other types of memory not limited to SRAM bit cells may also be used to provide random settling times that can be used as entropy sources for random number generators.

Figure 8:
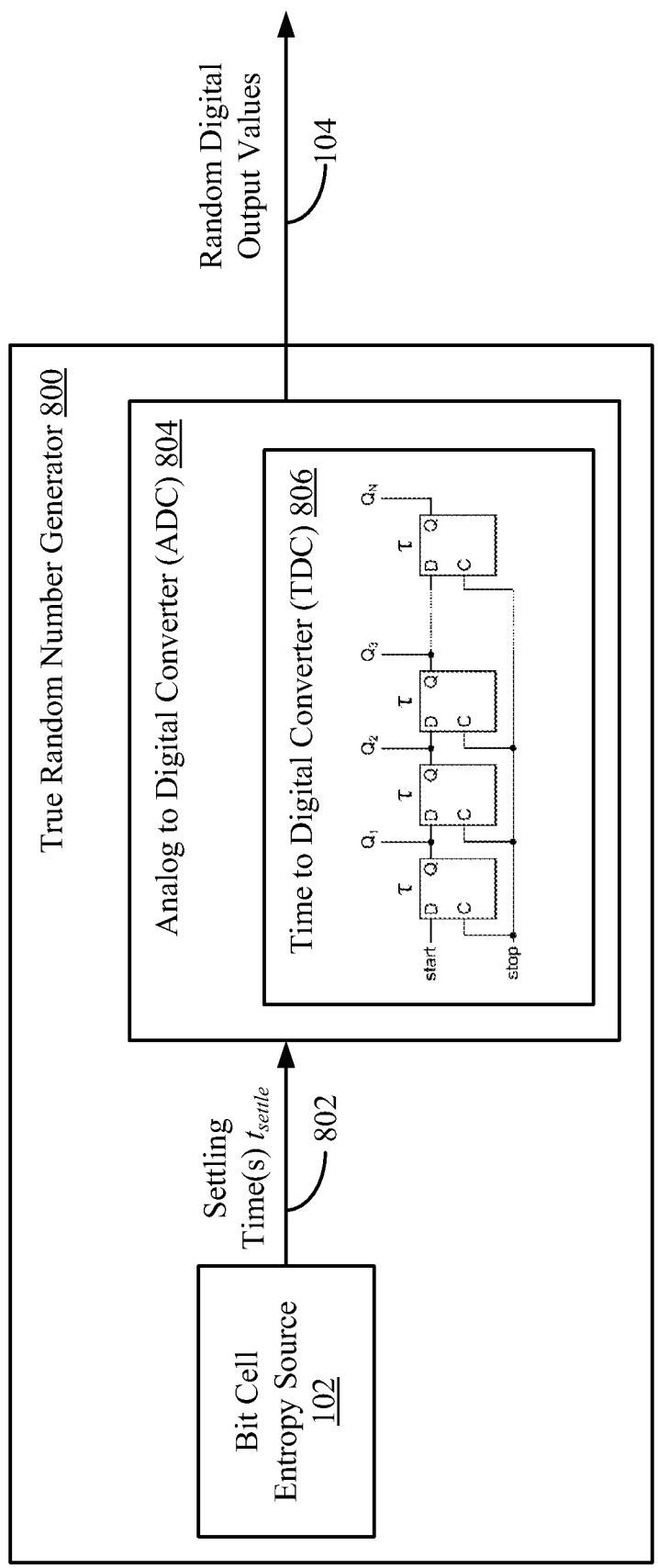
FIG. 8 illustrates a first exemplary high-level block diagram of a true random number generator.

FIG. 8 illustrates a high-level block diagram of a true random number generator 800 according to one aspect. The true random number generator 800 includes the bit cell based entropy source 102 (e.g., described in FIGS. 1-7) and an analog to digital converter (ADC) 804. The ADC 804 converts the random settling time $t_{settle}$ 802 into the random digital output values 104. (One or more conditioning algorithms, as described above with respect to FIG. 1, may also be used to increase the entropy of the random digital output values 104.) Since the settling time $t_{settle}$ 802 is random the output values 104 are random too. In one aspect, the ADC 804 is a time to digital converter (TDC) 806 that is configured to convert the settling time $t_{settle}$ 802 into the random digital output values 104. According to one example, and referring to FIGS. 2, 3, 4, 5, and 8, this can be performed by starting the TDC 806 (i.e., start signal) when the bit cell's pre-charge transistors 204, 206, 304, 306 are turned OFF at time $t_1$, and stopping the TDC 806 (i.e., stop signal) when the bit cell 200, 300 settles at time $t_4$.

The TDC 806 may be, but is not limited to, a tapped delay line TDC. Other types of TDCs may also be used. In one aspect, the TDC is a high resolution TDC operating at a high frequency. In other aspects, the TDC may be used in conjunction with an interpolator circuit to provide high resolution. In any case, the TDC may be designed to provide resolutions on the order of picoseconds or even less.

Figure 9:
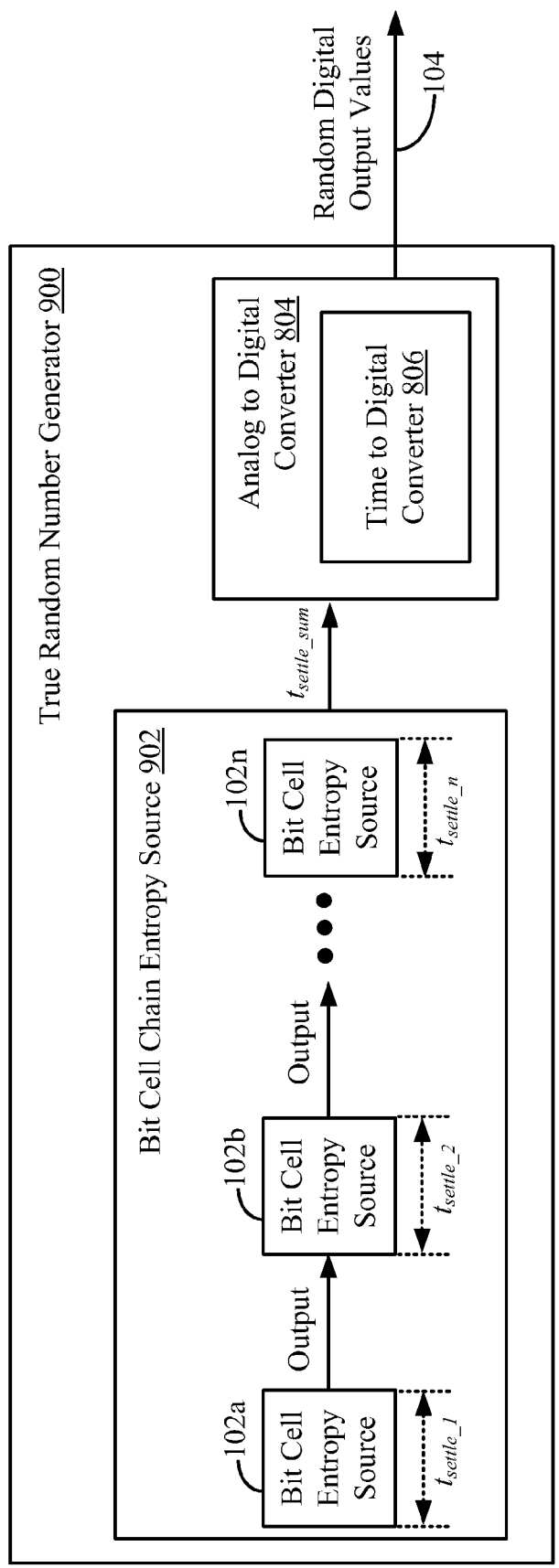
FIG. 9 illustrates a second exemplary high level block diagram of a true random number generator.

FIG. 9 illustrates a high level block diagram of a true random number generator 900 according to one aspect. In the illustrated example, the random number generator 900 includes a bit cell entropy source chain 902 (herein may also be referred to as a "bit cell chain"). The bit cell chain 902 includes a plurality of n number of bit cell entropy sources 102a, 102b, ... 102n coupled in series with the output of the first bit cell 102a coupled to the input of the second bit cell 102b, the output of the second bit cell 102b coupled to the input of the next bit cell, and so on. The bit cells 102a, 102b, 102n are substantively similar to the bit cell entropy sources 102 and/or the bit cells 200, 300, 600, 700 shown and described herein and with respect to FIGS. 1, 2, 3, 4, 5, 6, and/or 7.

Similar to the process described above with respect to FIGS. 2-5, the first bit cell 102a is initialized and then activated causing its output nodes to track each other and first reach $V_{PC}$ together and then diverge from one another, eventually settling to their final voltage values (e.g., full swing voltage values or some percentage of full swing) after a time $t_{settle\_1}$. The settling or settled output nodes of the first bit cell 102a activate the second bit cell 102b causing its pre-charged output nodes to in turn settle to their respective final voltage values after a time $t_{settle\_2}$. Similarly, the settling or settled output nodes of the second bit cell 102b activate the next bit cell in the chain 902 causing its pre-charged output nodes to settle to their respective final voltage values, and so on until the last bit cell 102n in the chain 902 also settles to its final voltage values after a time $t_{settle\_n}$.

The total settling time $t_{settle\_sum}$ of the bit cell chain 902 represents the amount of time it takes from the activation of the first bit cell 102a to final settling of the last bit cell 102n of the chain 902 ($t_{settle\_sum} \approx t_{settle\_1} + t_{settle\_2} + \ldots + t_{settle\_n}$). Since the individual settling times $t_{settle\_1} + t_{settle\_2} + \ldots + t_{settle\_n}$ are random, the total settling time $t_{settle\_sum}$ is random too. Thus, the settling time $t_{settle\_sum}$ may be converted by the ADC 804 and/or TDC 806 into a random number bitstring.

The settling time $t_{settle\_sum}$ of the chain 902 is much longer than the settling times $t_{settle\_1}, t_{settle\_2}, \ldots t_{settle\_n}$ of the individual bit cells 102a, 102b, ... 102n. The bit cell chain's 902 relatively long settling time $t_{settle\_sum}$ allows design constraints of the ADC 804 and/or the TDC 806 to be loosened. For example, the ADC 804 and/or the TDC 806 can have less precision than it ordinarily would need to have if it were being used to accurately and precisely measure the settling time of a single bit cell. The number n of the bit cells 102a, 102b, ... 102n comprising the bit cell chain 902 may be chosen such that the total settling time $t_{settle\_sum}$ can be easily measured using an ADC 804 and/or TDC 806 that does not necessarily have a high degree of precision. As just one non-limiting, non-exclusive example, the settling time of a single bit cell 102a, 102b, ... 102n may be on the order of 1 ns and the total settling time $t_{settle\_sum}$ may on the order of 100 ns-1 μs. Thus, the chain 902 may include on the order of 100 to 1,000 bit cells 102a, 102b, ... 102n. According to other examples the chain 902 may include more or less bit cells.

Figure 10:
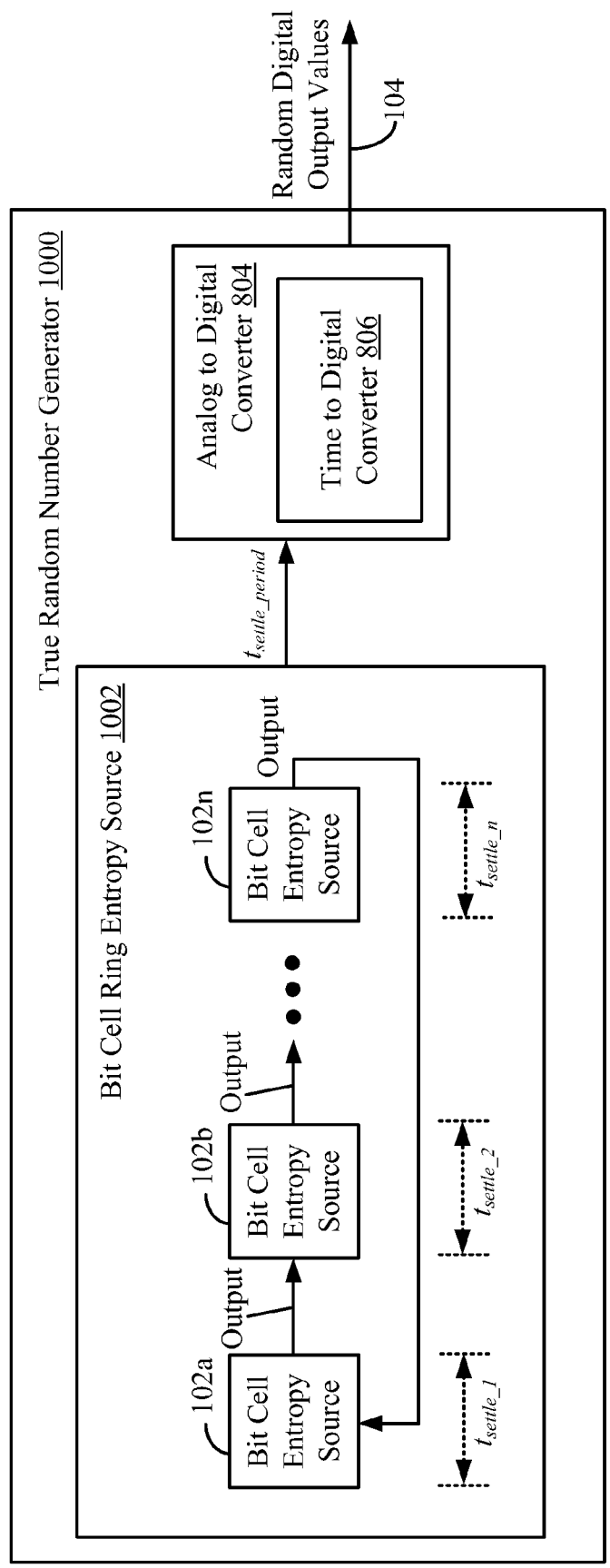
FIG. 10 illustrates a third exemplary high level block diagram of a true random number generator.

FIG. 10 illustrates a high level block diagram of a true random number generator 1000 according to one aspect. In the illustrated example, the random number generator 1000 includes a bit cell entropy source ring 1002 (herein may also be referred to as a "bit cell ring" and a "bit cell ring oscillator"). The bit cell ring 1002 includes a plurality of n number of bit cell entropy sources 102a, 102b, ... 102n coupled in a ring formation with the output of the first bit cell 102a coupled to the input of the second bit cell 102b, the output of the second bit cell 102b coupled to the input of the next bit cell, and so on until the output of the last bit cell 102n in the ring 1002 is coupled to the input of the first bit cell 102a. The bit cells 102a, 102b, ... 102n are substantively similar to the bit cell entropy sources 102 and/or the bit cells 200, 300, 600, 700 shown and described herein and with respect to FIGS. 1, 2, 3, 4, 5, 6, and/or 7.

Similar to the process described above with respect to FIGS. 2-5, the first bit cell 102a is initialized and then activated causing its output nodes to track each other and first reach $V_{PC}$ together and then diverge from one another, eventually settling to their final voltage values (e.g., full swing voltage values or some percentage of full swing) after a time $t_{settle\_1}$. The settling or settled output nodes of the first bit cell 102a activate the second bit cell 102b causing its pre-charged output nodes to in turn settle to their respective final voltage values after a time $t_{settle\_2}$. Similarly, the settling or settled output nodes of the second bit cell 102b activate the next bit cell in the ring 1002 causing its pre-charged output nodes to settle to their respective final voltage values, and so on until the last bit cell 102n in the ring 1002 also settles to its final value after a time $t_{settle\_n}$. Assuming the first bit cell 102a in the ring 1002 has been reinitialized (e.g., its pre-charge transistors 204, 206, 304, 306 are turned ON), the settling or settled output nodes of the last bit cell 102n again activate (e.g., turn OFF its pre-charge transistors 204, 206, 304, 306) the first bit cell 102a in the ring 1002 causing its own output nodes to again settle to some final voltage values after a time $t_{settle\_1}$. In this fashion, each bit cell 102a, 102b, ... 102n of the bit cell ring 1002 continues cycling through periods of initialization and activation thereby contributing a random settling time to the overall period of the ring 1002. The bit cells 102a, 102b, ... 102n may be reinitialized after activation through external circuitry or through the outputs of the ring's bit cells 102, 102b, ... 102n themselves as described below.

The settling time $t_{settle\_period}$ of the bit cell ring 1002 represents the amount of time it takes from the activation of the first bit cell 102a of the ring 1002 to the subsequent reactivation of the first bit cell 102a. That is, the settling time $t_{settle\_period}$ is the settling time period of the ring 1002 and $t_{settle\_period} \approx t_{settle\_1} + t_{settle\_2} + \ldots + t_{settle\_n}$. Since the individual settling times $t_{settle\_1} + t_{settle\_2} + \ldots + t_{settle\_n}$ are random, the periodic settling time $t_{settle\_period}$ during any one period of the ring 1002 is random too. Thus, the settling time $t_{settle\_period}$ (or accumulations of it) may be converted by the ADC 804 and/or TDC 806 into a random number bitstring.

The settling time $t_{settle\_period}$ of the ring is much longer than the settling times $t_{settle\_1}, t_{settle\_2}, t_{settle\_n}$ of the individual bit cells 102a, 102b, ... 102n. Consequently, the bit cell ring's 1002 relatively long settling time $t_{settle\_period}$ allows design constraints of the ADC 804 and/or the TDC 806 to be loosened. For example, the ADC 804 and/or the TDC 806 can have less precision than it ordinarily would need to have if it were being used to accurately and precisely measure the settling time of a single bit cell. The number n of the bit cells 102a, 102b, ... 102n comprising the bit cell ring 1002 may be chosen such that the total settling time $t_{settle\_sum}$ can be easily measured using an ADC 804 and/or TDC 806 that does not necessarily have a high degree of precision. As just one non-limiting, non-exclusive example, the settling time of a single bit cell 102a, 102b, ... 102n may be on the order of 1 ns and the total settling time $t_{settle\_sum}$ may on the order of 100 ns-1 μs. Thus, the ring 1002 may include on the order of 100 to 1,000 bit cells 102a, 102b, ... 102n. According to other examples the ring 1002 may include more or less bit cells.

Figure 11:
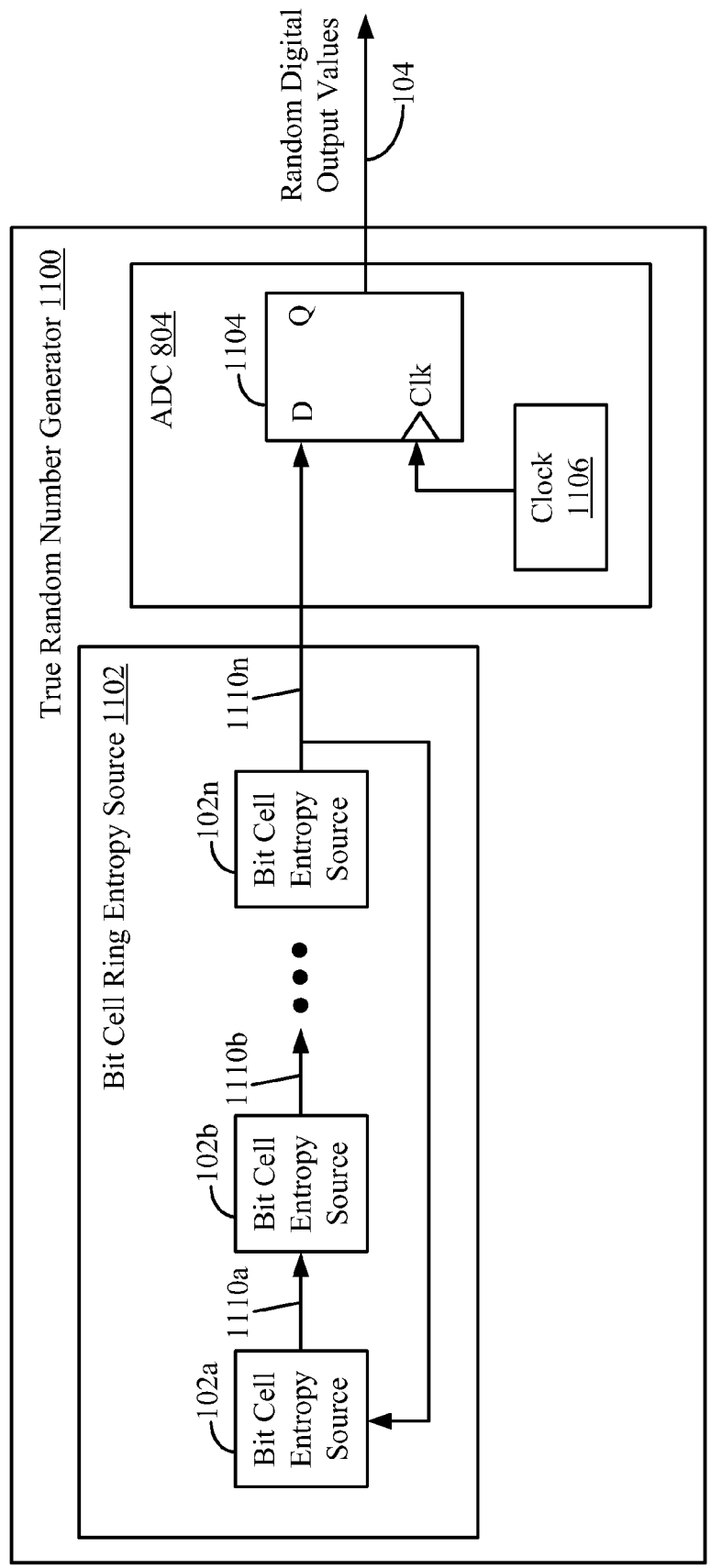
FIG. 11 illustrates a fourth exemplary high level block diagram of a true random number generator.

FIG. 11 illustrates a high level block diagram of a true random number generator 1100 according to one aspect. In the illustrated example, the random number generator 1100 includes a bit cell entropy source ring 1102 and an ADC 804. The bit cell ring 1102 includes a plurality of bit cells 102a, 102b, . . . 102n each having an output 1110a, 1110b, 1110n, respectively. The bit cells 102a, 102b, . . . 102n are substantively similar to the bit cell entropy sources 102 and/or the bit cells 200, 300, 600, 700 shown and described herein and with respect to FIGS. 1, 2, 3, 4, 5, 6, and/or 7.

The random number generator 1100 of FIG. 11 is substantively similar to the random number generator 1000 shown in FIG. 10. For example, the bit cell ring 1102 of FIG. 11 operates in substantially the same way as the bit cell ring 1002 of FIG. 10 described above. In FIG. 11, however, the ADC 804 includes a flip-flop 1104 and a clock source 1106. The flip-flop 1104 samples the random output of one of the plurality of bit cells 102a, 102b, . . . 102n at a rate given by the clock 1106. As one non-limiting example, the flip-flop 1104 latches a bit cell's output value 1110n that is coupled to its D input over to the flip-flop's Q output on the rising or falling edge of the clock's 1106 signal. The Q output of the flip-flop 1104 may thus provide the random digital output values 104. The bit cell ring 1102 and flip-flop 1104 may be continuously operated to provide a continuous source of random digital output values 104 (e.g., continuous random digital bit stream). The flip-flop 1104 essentially measures phase that accumulates from the time the bit cell ring 1102 is enabled to the time the output 1110n is sampled, modulus the clock's 1106 sampling period, and then rounding the output to a logical "1" or "0". The jitter of the bit cell ring oscillator 1102 is much greater than an ordinary inverter based ring oscillator.

According to one aspect, in order to keep the bit cell ring 1102 oscillating (e.g., the bit cells 102a, 102b, . . . 102n repeatedly initialize and then settle), the output value of a preceding bit cell 102a, 102b, . . . 102n initializes/re-initializes a subsequent bit cell 102a, 102b, . . . 102n once every period of the bit cell ring 1102. Various bit cell ring 1102 architectures featuring various bit cell 102a, 102b, . . . 102n designs are possible. Some of these designs are described below as non-limiting, non-exclusive examples.

Figure 12:
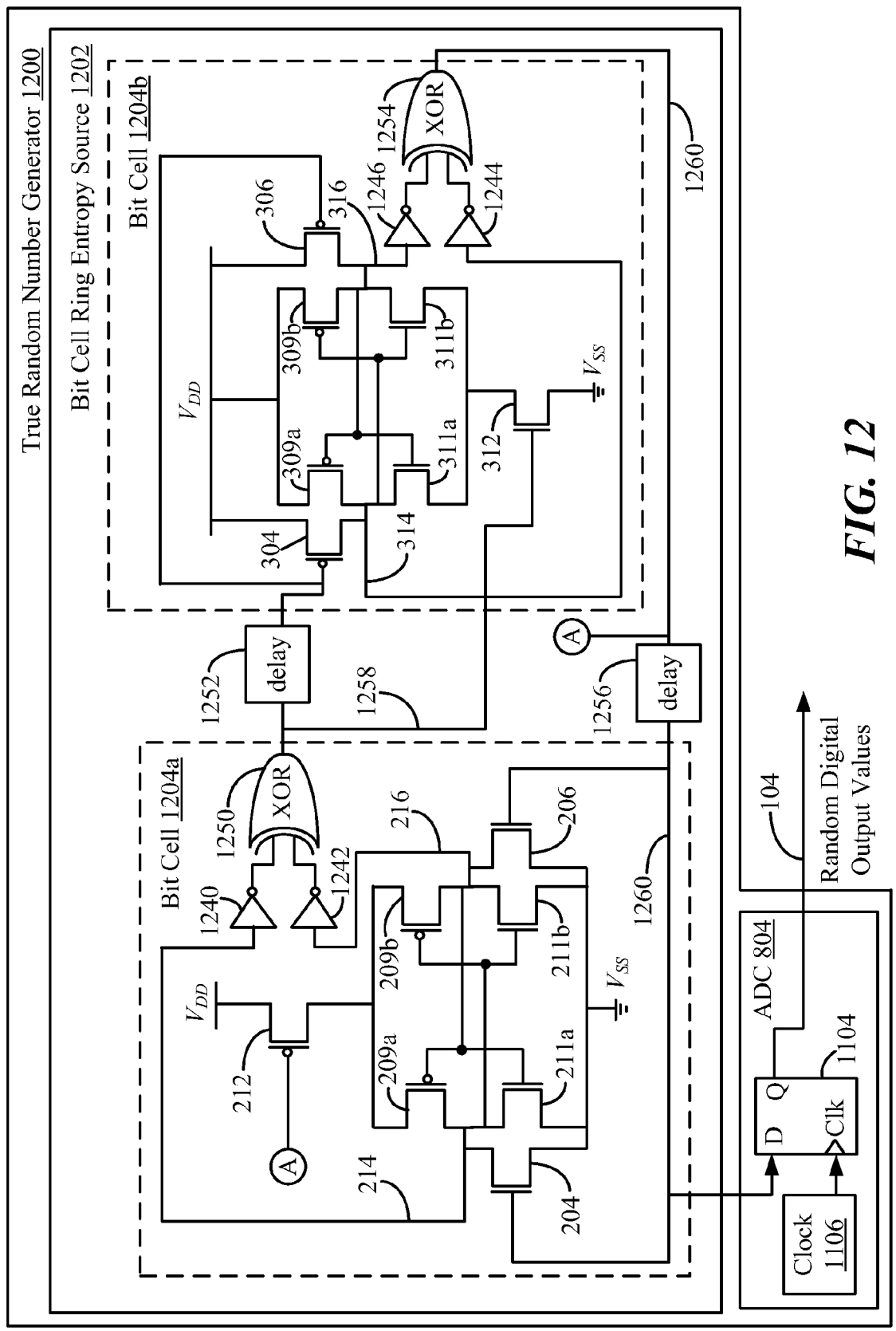
FIG. 12 illustrates a block diagram of a true random number generator that includes a first exemplary bit cell ring oscillator entropy source.

FIG. 12 illustrates a first exemplary block diagram of a true random number generator 1200 that includes a first exemplary bit cell ring oscillator entropy source 1202 according to one aspect of the disclosure. The example illustrated in FIG. 12 is merely one example of a bit cell ring oscillator 1102 based true random number generator 1100 described above with respect to FIG. 11. The bit cell ring oscillator based true random number generator 1200 of FIG. 12 is capable of generating a continuous supply of random digital output values. As described in detail below, the output value of a preceding bit cell 1204a, 1204b initializes/re-initializes a subsequent bit cell 1204a, 1204b once every period of the bit cell ring 1202 in order to keep the bit cell ring 1202 oscillating.

The bit cell ring 1202 may include a first bit cell 1204a, a second bit cell 1204b, a first delay element 1252, and a second delay element 1256. In the example shown, the first bit cell 1204a includes the p-type bit cell 200 shown in FIG. 2. Referring to FIG. 12, the outputs 214, 216 of the p-type bit cell 200 may be coupled to inverters 1240, 1242 whose outputs are in turn coupled (input into) an XOR gate 1250. The second bit cell 1204b includes the n-type bit cell 300 shown in FIG. 3. Referring to FIG. 12, the outputs 314, 316 of the n-type bit cell 300 may be coupled to inverters 1244, 1246 whose outputs are in turn coupled (input into) an XOR gate 1254. The output 1258 of the first bit cell 1204a is coupled to the inputs of the second bit cell 1204b, and the output 1260 of the second bit cell 1204b is coupled to the inputs of the first bit cell 1204a to form a ring oscillator structure. Operation of the bit cell ring 1202 shown in FIG. 12 is described below according to one example.

As an initial starting point it may be assumed that the voltage value at the first bit cell's 1204a enable transistor 212 goes from high "1" (e.g., positive supply line $V_{DD}$) to low "1" (e.g., negative supply line $V_{SS}$). A short time thereafter the voltage value at the first bit cell's 1204a pre-charge transistors 204, 206 also goes from high "1" to low "0" thereby turning OFF the pre-charge transistors 204, 206 and activating the first bit cell 1204a. This causes the voltage values at the output nodes 214, 216 of the first bit cell 1204a to transition from an initialization value of $V_{SS}$ and rise together to the pre-charge voltage level $V_{PC}$ (which may be about $0.5*V_{DD}$). The output node 214, 216 voltage values then diverge from one another after a random amount of time that is, in part, dictated by thermal and electrical noise at the bit cell 1204a. The voltage values at the output nodes 214, 216 will continue to diverge until they settle at or about their settling values, which may be their full swing voltage levels $V_{DD}$ and $V_{SS}$. The time $t_{settle}$ it takes for the first bit cell's 1204a output nodes 214, 216 to settle is random. Since the input values to the first bit cell's 1204a XOR gate 1250 are different (e.g., one is high "1" and one is low "0"), the output 1258 of the XOR gate 1250 will be high "1." The first bit cell's 1204a output 1258 value is propagated to the inputs of the enable transistor 312 and pre-charge transistors 304, 306 of the second bit cell 1204b. Specifically, the output value 1258 of the first bit cell 1204a that reaches the pre-charge transistors 304, 306 of the second bit cell 1204b may be slightly delayed (via a first delay element 1252) relative to the output value 1258 that arrives at the enable transistor 312 of the second bit cell 1204b.

The low "0" to high "1" transition at the inputs of the second bit cell's 1204b pre-charge transistors 304, 306 and enable transistor 312 causes the pre-charge transistors 304, 306 to turn OFF and the enable transistor 312 to turn ON, which activates the second bit cell 1204b. The enable transistor 312 turns ON slightly before the pre-charge transistors 304, 306 turn OFF due to the first delay element 1252. This causes the voltage values at the output nodes 314, 316 of the second bit cell 1204b to transition from an initialization value of $V_{DD}$ and fall together to the pre-charge voltage level $V_{PC}$ (which may be about $0.5*V_{DD}$). The output node 314, 316 voltage values then diverge from one another after a random amount of time that is, in part, dictated by thermal and electrical noise at the bit cell 1204b. The voltage values at the output nodes 314, 316 will continue to diverge until they settle at their settling values, which may be at or about their full swing voltage levels $V_{DD}$ and $V_{SS}$. Thus, the settling value of a preceding bit cell (e.g., the first bit cell 1204a) causes the output node of a subsequent bit cell (e.g., the second bit cell 1204b) to transition from its initialization value to a settling value. The time $t_{settle}$ it takes for the second bit cell's 1204b output nodes 314, 316 to settle is random. Since the input values to the second bit cell's 1204b XOR gate 1254 are different (e.g., one is high "1" and one is low "0"), the output 1260 of the XOR gate 1254 will be high "1." The second bit cell's 1204b output 1260 value is propagated back to the inputs of the enable transistor 212 and pre-charge transistors 204, 206 of the first bit cell 1204a. Specifically, the output value 1260 of the second bit cell 1204b that reaches the pre-charge transistors 204, 206 of the first bit cell 1204a may be slightly delayed (via a second delay element 1256) relative to the output value 1260 that arrives at the enable transistor 212 of the first bit cell 1204a.

The low "0" to high "1" transition at the inputs of the first bit cell's 1204a pre-charge transistors 204, 206 and enable transistor 212 causes the pre-charge transistors 204, 206 to turn ON and the enable transistor 212 to turn OFF. The enable transistor 212 turns OFF slightly before the pre-charge transistors 204, 206 turn ON due to the second delay element 1256. This causes the voltage values at the output nodes 214, 216 of the first bit cell 1204a to be low "0" since the output nodes 214, 216 are coupled to the negative supply line $V_{SS}$. At this point the first bit cell 1204a may be considered initialized (also referred to herein as "deactivated"). Since the input values to the first bit cell's 1204a XOR gate 1250 are the same (e.g., both are high "1"), the output 1258 of the XOR gate 1250 will be low "0." This value is propagated to the inputs of the second bit cell 1204b. Thus, the output value of the preceding bit cell (e.g., the second bit cell 1204b) initializes (e.g., re-initializes) the subsequent bit cell (e.g., the first bit cell 1204a) once every period of the bit cell ring 1202 in order to keep the bit cell ring 1202 oscillating.

The high "1" to low "0" transition at the inputs of the second bit cell's 1204b pre-charge transistors 304, 306 and enable transistor 312 causes the pre-charge transistors 304, 306 to turn ON and the enable transistor 312 to turn OFF. The enable transistor 312 turns OFF slightly before the pre-charge transistors 304, 306 turn ON due to the first delay element 1252. This causes the voltage values at the output nodes 314, 316 of the second bit cell 1204b to be high "1" since the output nodes 314, 316 are coupled to the positive supply line $V_{DD}$. At this point the second bit cell 1204b is initialized. Since the input values to the second bit cell's 1204b XOR gate 1254 are the same (e.g., both are low "0"), the output 1260 of the XOR gate 1254 will be low "0." Thus, the output value of the preceding bit cell (e.g., the first bit cell 1204a) initializes (e.g., re-initializes) the subsequent bit cell (e.g., the second bit cell 1204b) once every period of the bit cell ring 1202 in order to keep the bit cell ring 1202 oscillating.

The low "0" output 1260 at the second bit cell 1204b is propagated to the inputs of the first bit cell 1204a, which again activates (i.e., reactivates) the first bit cell 1204a as described above. The processes of activation and deactivation/initialization of the bit cells 1204a, 1204b may continuously repeat until the bit cell ring 1202 is disabled (e.g., powered OFF). The time between activation and reactivation of a bit cell 1204a, 1204b of the bit cell ring oscillator 1202 marks the periodic settling time $t_{settle\_period}$ of the bit cell ring 1202.

An XOR output 1258, 1260 of one of the bit cells 1204a, 1204b may then be sampled by, for example, the flip-flop 1104. In the example shown, the XOR output 1260 of the second bit cell 1204b is coupled to the D input of the flip-flop 1104. In other examples the XOR output 1258 of the first bit cell 1204a may be coupled to the D input of the flip-flop 1104 instead. A clock 1106 may supply a periodic clock signal to the flip-flop 1104. Consequently, the flip-flop 1104 periodically samples the value at the output node 1260 and latches that value to its Q output. The bit value at the output node 1260 of the second bit cell 1204b at any given time is random due to the fact that the settling times $t_{settle}$ of the bit cells 1204a, 1204b are random and different from one period of the bit cell ring 1202 to another period. Since the value of the output node 1260 at any given time of sampling by the flip-flop 1104 is random, the bit values at the Q output of the flip-flop 1104 is also random. Thus, a plurality of random digital output values 104 is supplied by the flip-flop 1104. The flip-flop 1104 may continuously supply the random digital output values (e.g., random bits) at a bit rate equal to the sampling rate (e.g., rate of the clock 1106) of the flip-flop 1104. Conditioning algorithm circuits (shown in FIG. 1) may be used to help increase the entropy by reducing or eliminating any bias present at the random digital output values 104. Although a flip-flop 1104 is used to sample the output 1260, other sampling circuit elements may be used to capture the random output values of the bit cell 1204a, 1204b outputs.

In the example shown in FIG. 12, there are two bit cells 1204a, 1204b that comprise the bit cell ring 1202. However, the bit cell ring 1202 may be include various numbers of bit cells not limited to two (2). For example, the bit cell ring 1202 may include 4n−2 bit cells (n is a positive integer greater than or equal to one (1)) where the bit cells of the ring 1202 alternate between the p-type+XOR bit cells 1204a and the n-type+XOR bit cells 1204b shown in FIG. 12. The p-type+XOR bit cell 1204a may be seen generally as acting like an inverter in that a low "0" value fed to its inputs 1260 generates a high "1" value at its output 1258, and similarly a high "1" value fed to its inputs 1260 generates a low "0" value at its output 1258. Conversely, the n-type+XOR bit cell 1204b may be seen generally as acting like a buffer in that a low "0" value fed to its inputs 1258 generates a low "0" value at its output 1260, and similarly a high "1" value fed to its inputs 1258 generates a high "1" value at its output 1260. Coupling these two bit cells 1204a, 1204b together results in a net inverting operation where inputting a low "0" value to the first bit cell's 1204a input results in a high "1" output at the second bit cell 1204b, and similarly inputting a high "1" value to the first bit cell's 1204a input results in a low "0" output at the second bit cell 1204b. In this fashion it may be generally understood that a single run from the first bit cell 1204a to the last bit cell 1204b of the ring results in a 180 degree shift of the bit inputted to the first bit cell 1204a and may represent half a period of the bit cell ring 1202. A subsequent run through the ring oscillator results in another 180 degree shift of the last bit cell's 1204b output value returning the input of the first bit cell 1204a back to its initial starting bit value (full period of the bit cell ring 1202).

Figure 13:
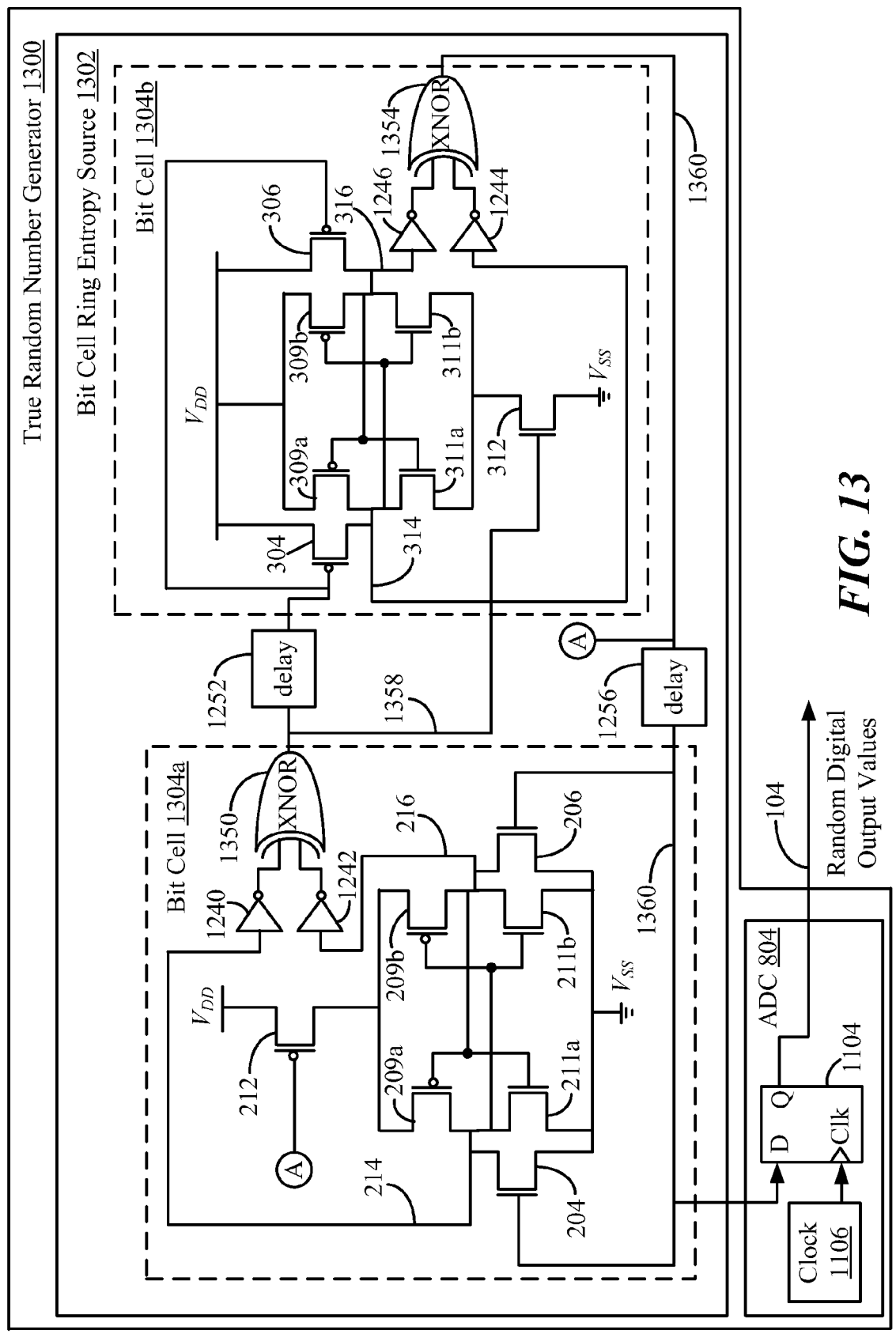
FIG. 13 illustrates a block diagram of a true random number generator that includes a second exemplary bit cell ring oscillator entropy source.
Figure 14:
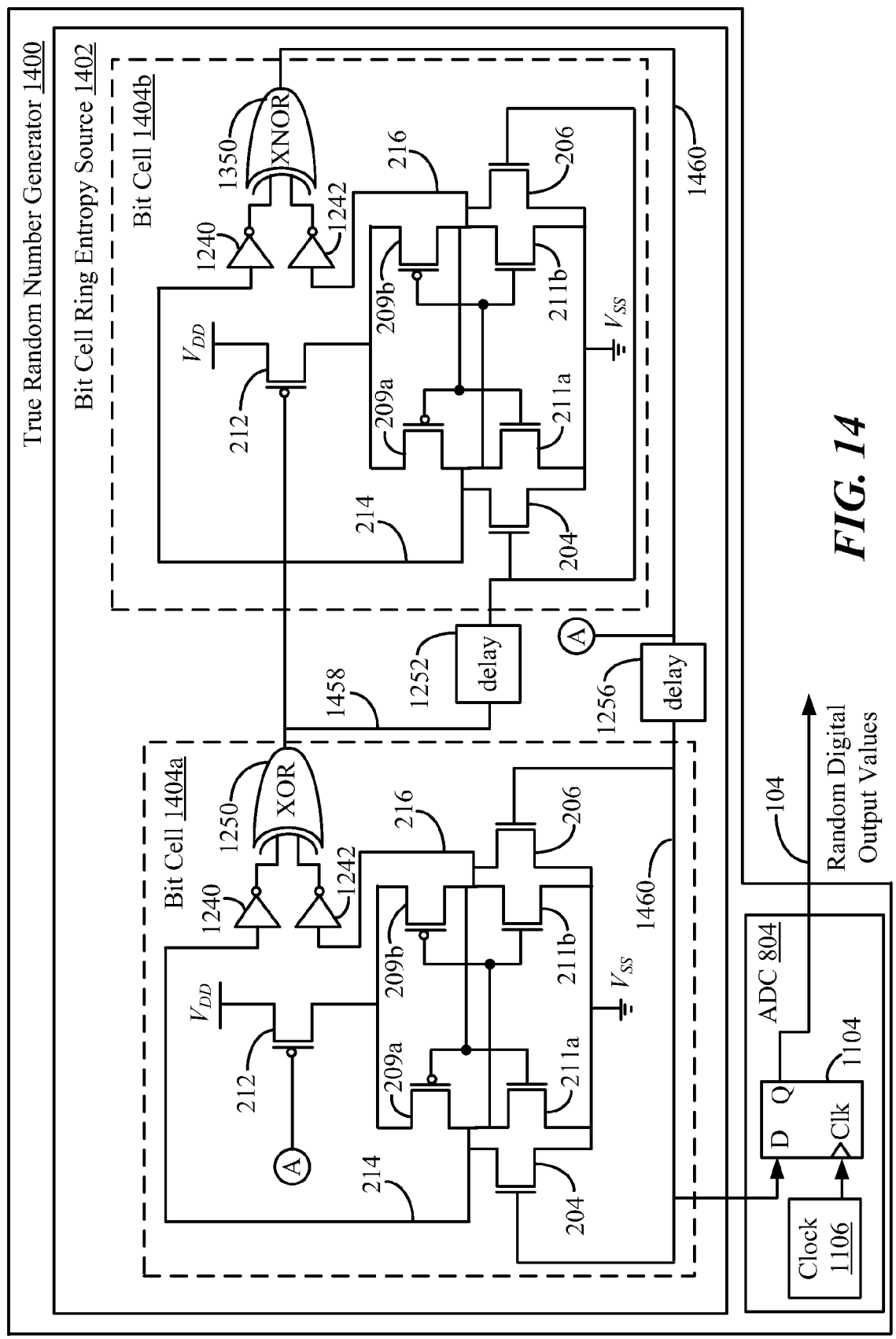
FIG. 14 illustrates a block diagram of a true random number generator that includes a third exemplary bit cell ring oscillator entropy source.
Figure 15:
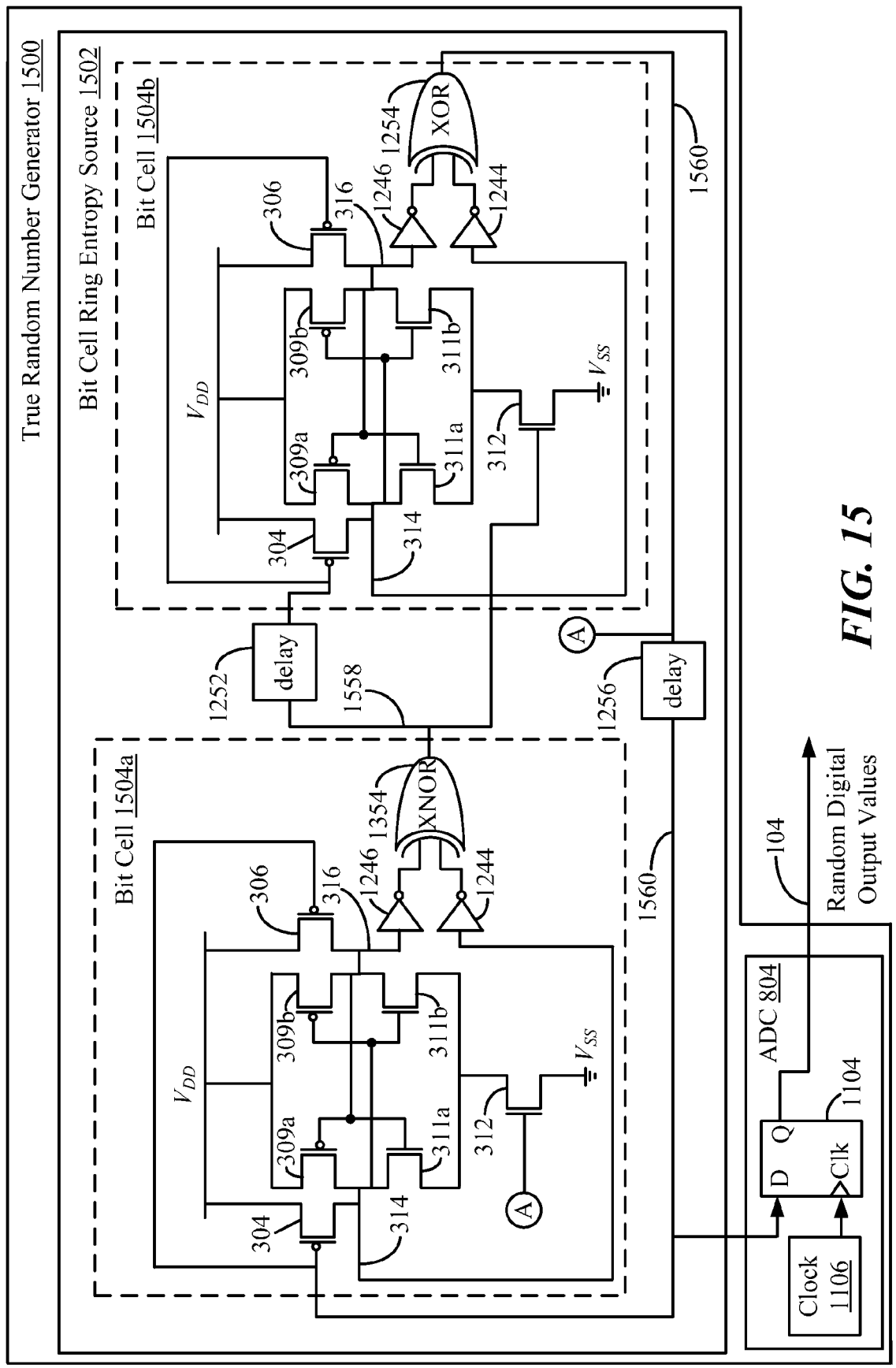
FIG. 15 illustrates a block diagram of a true random number generator that includes a fourth exemplary bit cell ring oscillator entropy source.

Based on the above analysis and referring back to FIG. 11, the number, type, and gating used (e.g., XOR vs. XNOR vs. other gates) for the bit cells 102a, 102b, . . . 102n for the bit cell ring 1102 may be therefore designed such that a single run through from the first bit cell 102a of the ring 1102 to the last bit cell 102n of the ring 1102 results in a 180 degree shift and/or represents half a period of the bit cell ring 1102. FIGS. 13, 14, and 15 below illustrate other non-limiting, non-exclusive examples of bit cell configurations for the bit cell ring 1102.

FIG. 13 illustrates a block diagram of a true random number generator 1300 that includes a second exemplary bit cell ring oscillator entropy source 1302 according to one aspect of the disclosure. The bit cell ring 1302 of FIG. 13 is identical to the bit cell ring 1202 of FIG. 12 except that the bit cells 1304a, 1304b of FIG. 13 feature XNOR gates 1350, 1354 instead of XOR gates 1250, 1254 as shown in FIG. 12. The output 1358 of the first bit cell 1304a couples to the inputs of the second bit cell 1304b, and the output 1360 of the second bit cell 1304b couples to the inputs of the first bit cell 1304a. An output 1360 of one of the bit cells 1304b is sampled by a means for sampling (e.g., the ADC 804 shown in FIG. 13) to generate a plurality of random digital output values 104.

The design shown in FIG. 13 results in the p-type+XNOR bit cell 1304a acting generally as a buffer (e.g., low "0" input results in low "0" output, etc.) and the n-type+XNOR bit cells 1304b acting generally as an inverter (e.g., low "0" input results in high "1" output and vice versa). Coupling these two 1304a, 1304b to each other as shown results again in a 180 degree shift from the input value of the first bit cell 1304a of the ring 1302 to the output value of the last bit cell 1304b of the ring 1302 after a single run through the ring 1302. In the example shown in FIG. 13, there are two bit cells 1304a, 1304b that comprise the bit cell ring 1302. However, the bit cell ring 1302 may be include various numbers of bit cells not limited to two (2). For example, the bit cell ring 1302 may include 4n−2 bit cells (n is a positive integer greater than or equal to one (1)) where the bit cells of the ring 1302 alternate between the p-type+XNOR bit cells 1304a and the n-type+XNOR bit cells 1304b shown in FIG. 13.

FIG. 14 illustrates a block diagram of a true random number generator 1400 that includes a third exemplary bit cell ring oscillator entropy source 1402 according to one aspect of the disclosure. The bit cell ring 1402 of FIG. 14 is substantively similar in operation to the bit cell rings 1202, 1302 of FIGS. 12 and 13. However, the bit cell ring 1402 of FIG. 14 features a p-type+XOR first bit cell 1404a (identical to the first bit cell 1204a shown in FIG. 12) coupled to a p-type+XNOR second bit cell 1404b (identical to the first bit cell 1304a shown in FIG. 13). The output 1458 of the first bit cell 1404a couples to the inputs of the second bit cell 1404b, and the output 1460 of the second bit cell 1404b couples to the inputs of the first bit cell 1404a. An output 1460 of one of the bit cells 1404b is sampled by a means for sampling (e.g., the ADC 804 shown in FIG. 14) to generate a plurality of random digital output values 104.

The design shown in FIG. 14 results in the p-type+XOR bit cell 1404a acting generally as an inverter (e.g., low "0" input results in high "1" output and vice versa) and the p-type+XNOR bit cell 1404b acting as a buffer (e.g., low "0" input results in low "0" output, etc.). Coupling these two 1404a, 1404b to each other as shown results again in a 180 degree shift from the input value of the first bit cell 1404a of the ring 1402 to the output value of the last bit cell 1404b of the ring 1402 after a single run through the ring 1402. In the example shown in FIG. 14, there are two bit cells 1404a, 1404b that comprise the bit cell ring 1402. However, the bit cell ring 1402 may be include various numbers of bit cells not limited to two (2). For example, the bit cell ring 1402 may include 4n−2 bit cells (n is a positive integer greater than or equal to one (1)) where the bit cells of the ring 1402 alternate between the p-type+XOR bit cells 1404a and the p-type+XNOR bit cells 1404b shown in FIG. 14.

FIG. 15 illustrates a block diagram of a true random number generator 1500 that includes a fourth exemplary bit cell ring oscillator entropy source 1502 according to one aspect of the disclosure. The bit cell ring 1502 of FIG. 15 is substantively similar in operation to the bit cell rings 1202, 1302 of FIGS. 12 and 13. However, the bit cell ring 1502 of FIG. 15 features an n-type+XNOR first bit cell 1504a (identical to the second bit cell 1304b shown in FIG. 13) coupled to an n-type+XOR second bit cell 1504b (identical to the second bit cell 1204a shown in FIG. 12). The output 1558 of the first bit cell 1504a couples to the inputs of the second bit cell 1504b, and the output 1560 of the second bit cell 1504b couples to the inputs of the first bit cell 1504a. An output 1560 of one of the bit cells 1504b is sampled by a means for sampling (e.g., the ADC 804 shown in FIG. 15) to generate a plurality of random digital output values 104.

The design shown in FIG. 15 results in the n-type+XNOR bit cell 1504a acting generally as an inverter (e.g., low "0" input results in high "1" output and vice versa) and the n-type+XOR bit cell 1504b acting as a buffer (e.g., low "0" input results in low "0" output, etc.). Coupling these two 1504a, 1504b to each other as shown results again in a 180 degree shift from the input value of the first bit cell 1504a of the ring 1502 to the output value of the last bit cell 1504b of the ring 1502 after a single run through the ring 1502. In the example shown in FIG. 15, there are two bit cells 1504a, 1504b that comprise the bit cell ring 1502. However, the bit cell ring 1502 may be include various numbers of bit cells not limited to two (2). For example, the bit cell ring 1502 may include 4n−2 bit cells (n is a positive integer greater than or equal to one (1)) where the bit cells of the ring 1502 alternate between the p-type+XOR bit cells 1504a and the p-type+XNOR bit cells 1504b shown in FIG. 15.

Referring to FIGS. 12-15, since the output nodes 214, 216, 314, 316 of the bit cells 1204a, 1204b, 1304a, 1304b, 1404a, 1404b, 1504a, 1504b are each input to an XOR or an XNOR gate whose output is the one sampled by the flip-flop 1104 instead of the bit cell output nodes 214, 216, 314, 316 directly, any bias that may be present at the cross-coupled inverters of the bit cells 1204a, 1204b, 1304a, 1304b, 1404a, 1404b, 1504a, 1504b that may cause the output nodes 214, 216, 314, 316 to settle to one particular logic value or another becomes irrelevant and does not significantly affect the entropy of the random number bit cell ring oscillators 1102, 1202, 1302, 1402, 1502. Thus, the random settling times of the bit cells 1204a, 1204b, 1304a, 1304b, 1404a, 1404b, 1504a, 1504b dictate the entropy of the bit cell rings 1102, 1202, 1302, 1402, 1502.

Figure 16:
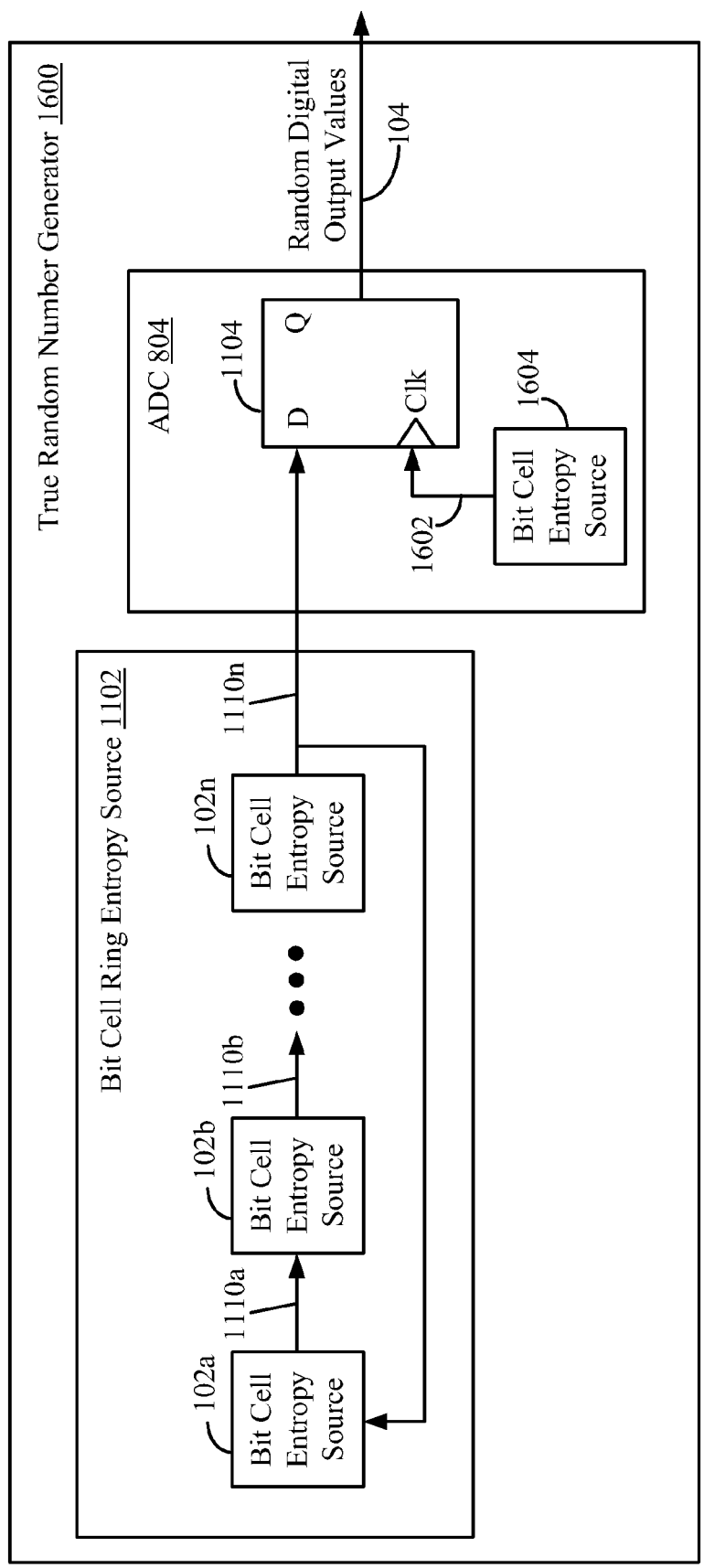
FIG. 16 illustrates a high level block diagram of a true random number generator.

FIG. 16 illustrates a high level block diagram of a true random number generator 1600 according to one aspect. The random number generator 1600 shown in FIG. 16 is identical to the random number generator 1100 shown in FIG. 11 except that the signal to the clock input of the flip-flop 1104 is provided by an output 1602 of another bit cell ring oscillator entropy source 1604. The bit cell ring oscillator entropy source 1604 may be any one of the bit cell ring oscillators 1102, 1202, 1302, 1402, 1502 shown and described herein including but not limited to those shown in FIGS. 11, 12, 13, 14, and 15. Having a bit cell ring oscillator provide the clock signal to the flip-flop 1104 rather than a standard clock may help increase the entropy of the true random number generator 100. The bit cell ring oscillator entropy source 1604 may also provide the clock signal 1602 to the flip-flops 1104 shown in FIGS. 12-15 instead of the standard periodic clock 1106.

Figure 17:
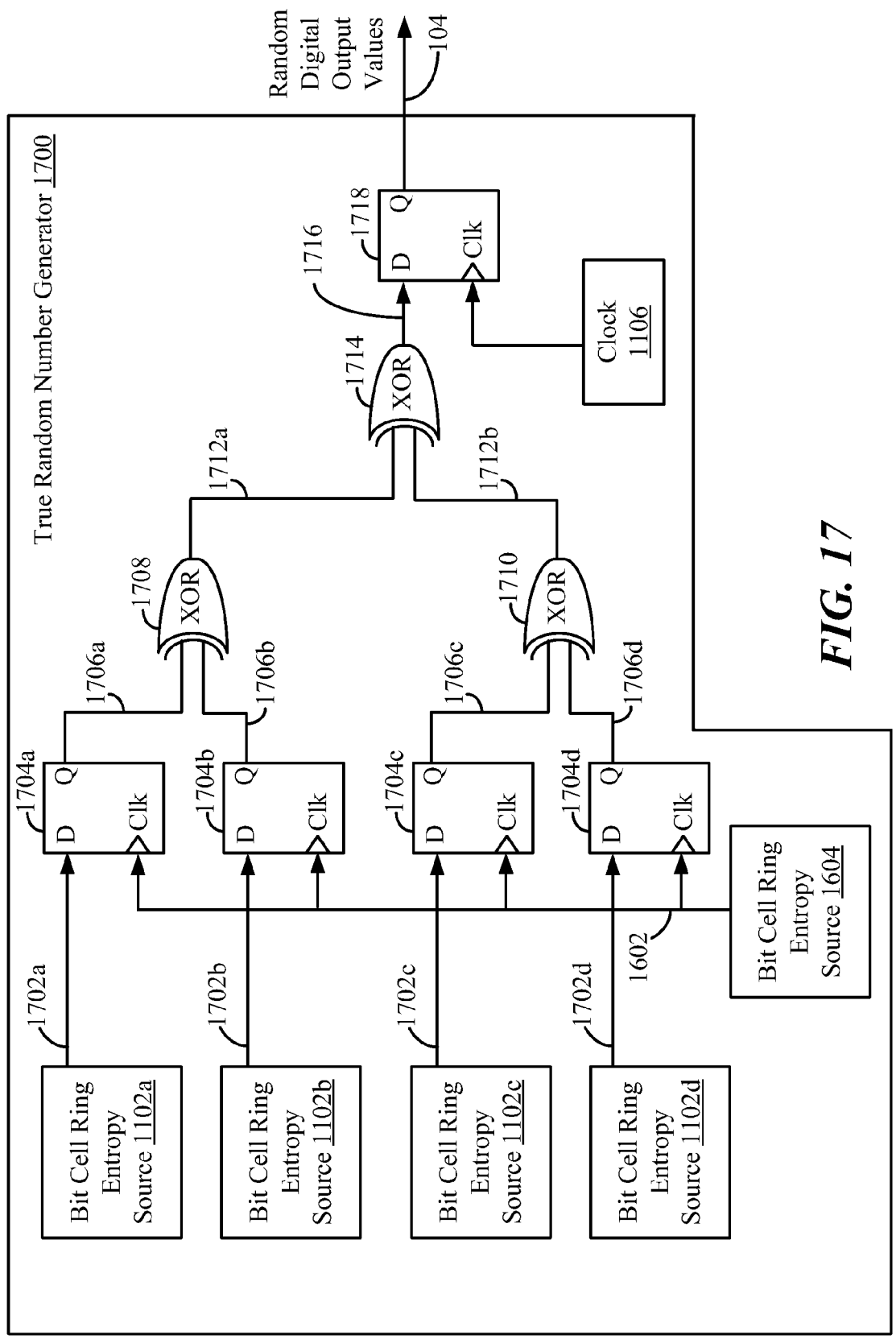
FIG. 17 illustrates a high level block diagram of a true random number generator featuring multiple bit cell ring oscillator entropy sources.

FIG. 17 illustrates a high level block diagram of a true random number generator 1700 featuring multiple bit cell ring oscillator entropy sources according to one aspect. The true random number generator 1700 includes a plurality of bit cell ring oscillators 1102a, 1102b, 1102c, 1102d each having an output 1702a, 1702b, 1702c, 1702d coupled to an input of a flip-flop 1704a, 1704b, 1704c, 1704d. The flip-flops 1704a, 1704b, 1704c, 1704d may have an output 1602 of another bit cell ring oscillator 1604 drive their clock (clk) inputs as shown in FIG. 17, or alternatively may have a standard periodic clock drive their clock inputs (e.g., like the clock 1106 shown in FIG. 11). In the illustrated example, four bit cell ring oscillators 1102a, 1102b, 1102c, 1102d and four flip-flops 1704a, 1704b, 1704c, 1704d are shown. However, any number of bit cell ring oscillators and flip-flops can be used including many more than four. Each one of the bit cell ring oscillators 1102a, 1102b, 1102c, 1102d, 1604 may be any one of the bit cell ring oscillators described herein including but not limited to the bit cell rings 1102, 1202, 1302, 1402, 1502 of FIGS. 11-15.

The outputs 1706a, 1706b, 1706c, 1706d of the flip-flops 1704a, 1704b, 1704c, 1704d are inputted into stages of XOR gates in order to ultimately have a single XOR output signal remaining, which will provide the random digital output values 104. Other gates in addition to or instead of XOR gates may be used too such as but not limited to XNOR gates. In the example illustrated in FIG. 17, two stages of XOR gates are used to reduce the number of flip-flop outputs 1706a, 1706b, 1706c, 1706d. The first stage includes two XOR gates 1708, 1710. A first pair of flip-flop outputs 1706a, 1706b is inputted into a first XOR gate 1708 and a second pair of flip-flop outputs 1706c, 1706d are inputted into a second XOR gate 1710. The outputs 1712a, 1712b of these XOR gates 1708, 1710 are then inputted into a second stage XOR gate 1714, which in turn generates a single XOR output signal 1716. In the example shown, only two stages of gates 1708, 1710, 1714 were needed to reduce the number of flip-flop outputs 1706a, 1706b, 1706c, 1706d down to one output 1716. In other examples more stages may be necessary to accomplish this. For example, 16 bit cell ring oscillator entropy sources may need four stages of gates, 32 bit cell ring oscillator entropy sources may need five stages of gates, and so on. Again, any one of the XOR gates 1708, 1710, 1714 may be replaced with XNOR gates.

The output 1716 of the last gate 1714 may then be inputted to another flip-flop 1718. The output of the flip-flop 1718 may represent the random digital output values 104 of the true random number generator 1700. According to one aspect, a plurality of flip-flops coupled in series (i.e., output of one flip-flop is coupled to the input of the subsequent flip-flop) may replace the single flip-flop 1718 shown. Either a standard periodic clock 1106 may drive the clock input of the flip-flop 1718 as shown or alternatively an output of yet another bit cell ring oscillator entropy source may be used to drive the clock input of the flip-flop 1718. Thus, a plurality of bit cell ring oscillators 1102a, 1102b, 1102c, 1102d, each including a plurality of bit cells arranged in a ring formation, have outputs 1702a, 1702b, 1702c, 1702d that are inputted into a gate stage where the gate stage has a plurality of gates 1708, 1710, 1714, the gate stage having a gate stage output 1716 that is sampled 1718 to generate the random digital output values 104.

Figure 18:
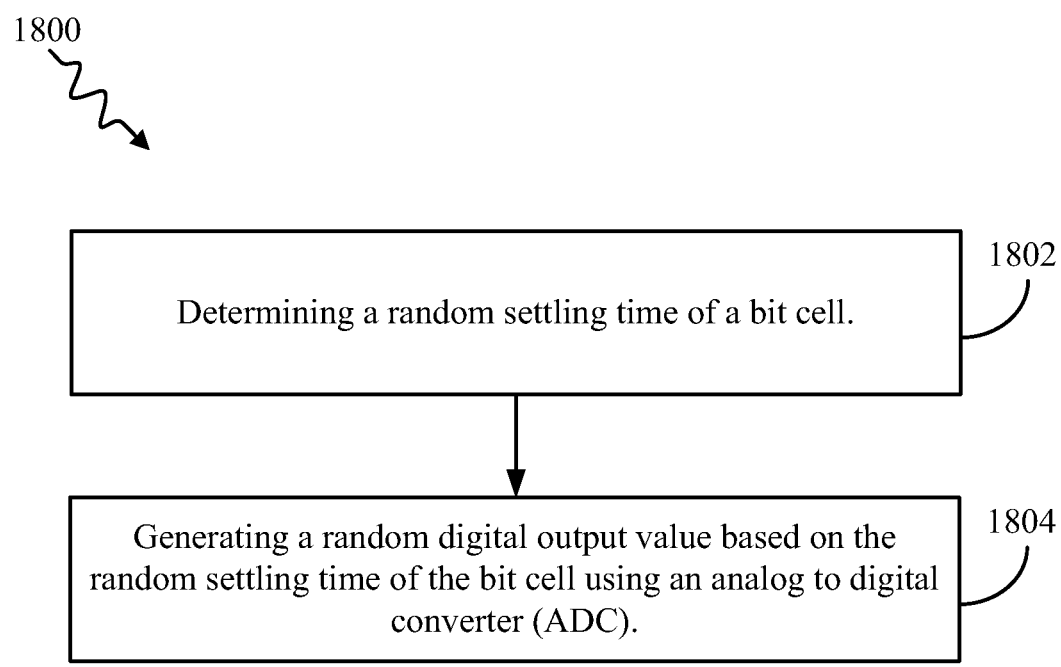
FIG. 18 illustrates a flow diagram of a method for generating random numbers.

FIG. 18 illustrates a flow diagram 1800 of a method for generating random numbers according to one aspect. First, a random settling time of a bit cell is determined 1802. Then, a random digital output value based on the random settling time of the bit cell is generated using an analog to digital converter (ADC) 1804. In one aspect, determining the random settling time of the bit cell includes initializing the bit cell to cause an output of the bit cell to be at an initialization voltage value, and activating the bit cell to transition the output of the bit cell from the initialization voltage value to a pre-charge voltage value and then to a settling voltage value. In another aspect, the random settling time of the bit cell is a duration of time elapsed from when the bit cell is activated to when the output of the bit cell reaches the settling value. In yet another aspect, the method further comprises coupling a plurality of bit cells in a ring formation such that an output of each of the plurality of bit cells is coupled to an input of a successive bit cell of the plurality of bit cells, and each bit cell of the plurality of bit cells has a random settling time. In another aspect, a periodic random settling time is equal to a sum of each of the random settling times of the plurality of bit cells, and the method further comprises generating the random digital output value based on the periodic random settling time using the ADC. In yet another aspect, the method further comprises sampling at least one output of a bit cell of the plurality of bit cells at a sampling rate to generate a plurality of random digital output values. In another aspect, the method further comprises coupling an input of a flip-flop to an output of a bit cell of the plurality of bit cells, coupling a clock input of the flip-flop to an output of a bit cell ring oscillator, and generating the plurality of random digital output values at an output of the flip-flop. In another aspect, the method further comprises coupling an input of a flip-flop to the output of the bit cell being sampled, providing a clock signal having the sampling rate to the flip-flop, and generating the plurality of random digital output values at an output of the flip-flop.

Figure 19:
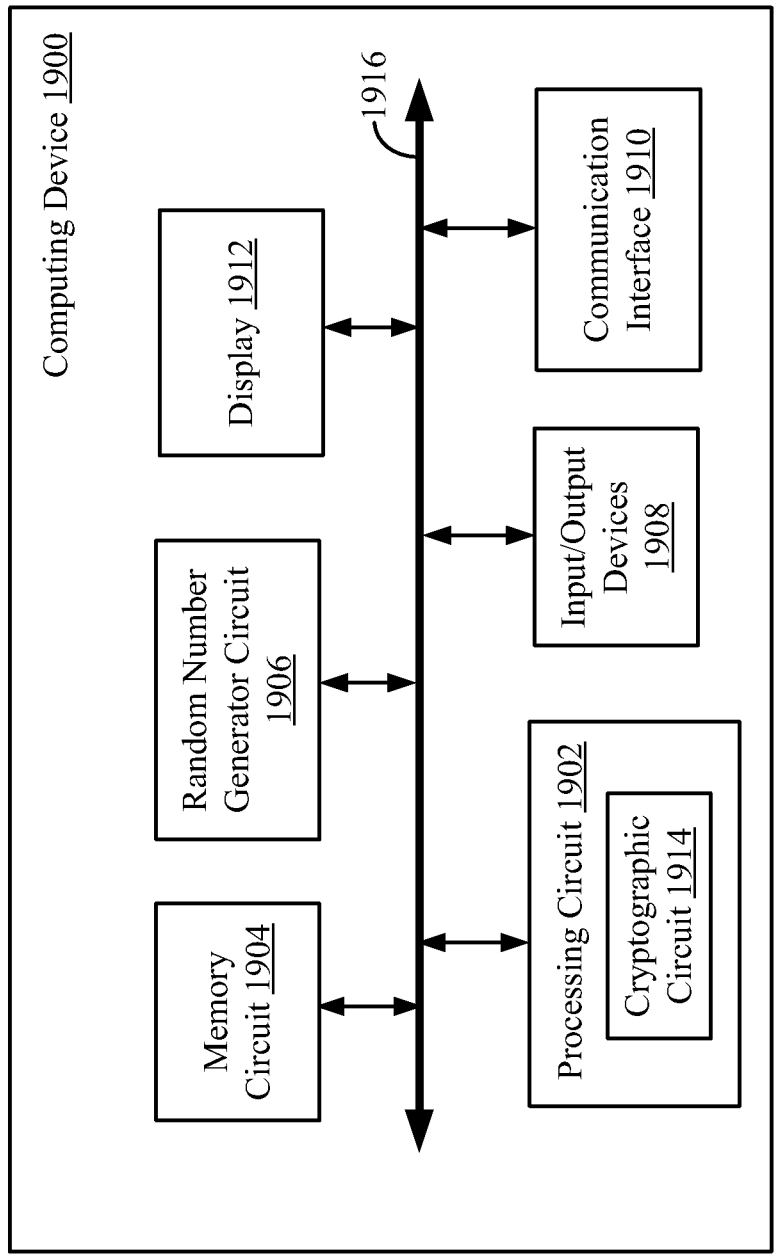
FIG. 19 illustrates a block diagram of a first exemplary computing device featuring a random number generator circuit.

FIG. 19 illustrates a first exemplary schematic block diagram of a computing device 1900 according to one aspect. The computing device 1900 may be, for example, a mobile phone, a smartphone, a tablet, a smartwatch, wearable communication glasses that include an optical head-mounted display, a laptop, a desktop computer, a personal digital assistant, and the like. The computing device 1900 may include a processing circuit 1902, a memory circuit 1904, a random number generator circuit 1906, input/output (I/O) devices 1908, a communication interface 1910, and/or a display 1912, where all or some of which may be communicatively coupled to each other through a communication bus 1916.

The processing circuit 1902 (e.g., processor, applications processor, etc.) may perform a variety of processing operations such as, but not limited to, executing software code stored within the memory circuit 1904. According to one example, the processing circuit 1902 may include a cryptographic circuit 1914 that executes cryptographic operations and algorithms. The memory circuit 1904 may include volatile memory such as, but not limited to, dynamic random access memory (DRAM), static random access memory (SRAM), magnetic random access memory (MRAM), etc. The memory circuit 1904 may also include non-volatile memory such as flash memory, magnetic disk drives, optical disk drives, solid state drives, etc. The memory circuit 1904 may store software code such as boot code, high-level operating system (HLOS) code, and/or other software application code for execution by the processing circuit 1902.

The random number generator circuit 1906 may include any one or more of the true random number generators 100, 800, 900, 1000, 1100, 1200, 1300, 1400, 1500, 1600, 1700 described herein. In one aspect, the cryptographic circuit 1914 may utilize the random digital output values (e.g., random numbers) generated by the random number generator circuit 1906 to use in cryptographic algorithms for key generation and/or data security protocols.

The I/O devices 1908 may include a mouse, trackball, keyboard, touchscreen display, printer, etc. The communication interface 1910 may include a wireless communication interface that can support mobile phone network communication protocols (e.g., cellular network communication protocols) and also short range wireless communication standards such as 802.11, Wi-Fi®, Bluetooth®, Zigbee®, etc. The communication interface 1910 may also include wired communication interfaces. The display 1912 may be any type of display device including, but not limited to, LCD displays, plasma displays, touchscreen displays, etc.

According to one aspect, the processing circuit 1902, the memory circuit 1904, the random number generator circuit 1906, and/or the communication interface 1910 may be all part of a single integrated circuit (e.g., system on chip). In other aspects, the random number generator circuit 1906 may be part of the processing circuit 1902.

Figure 20:
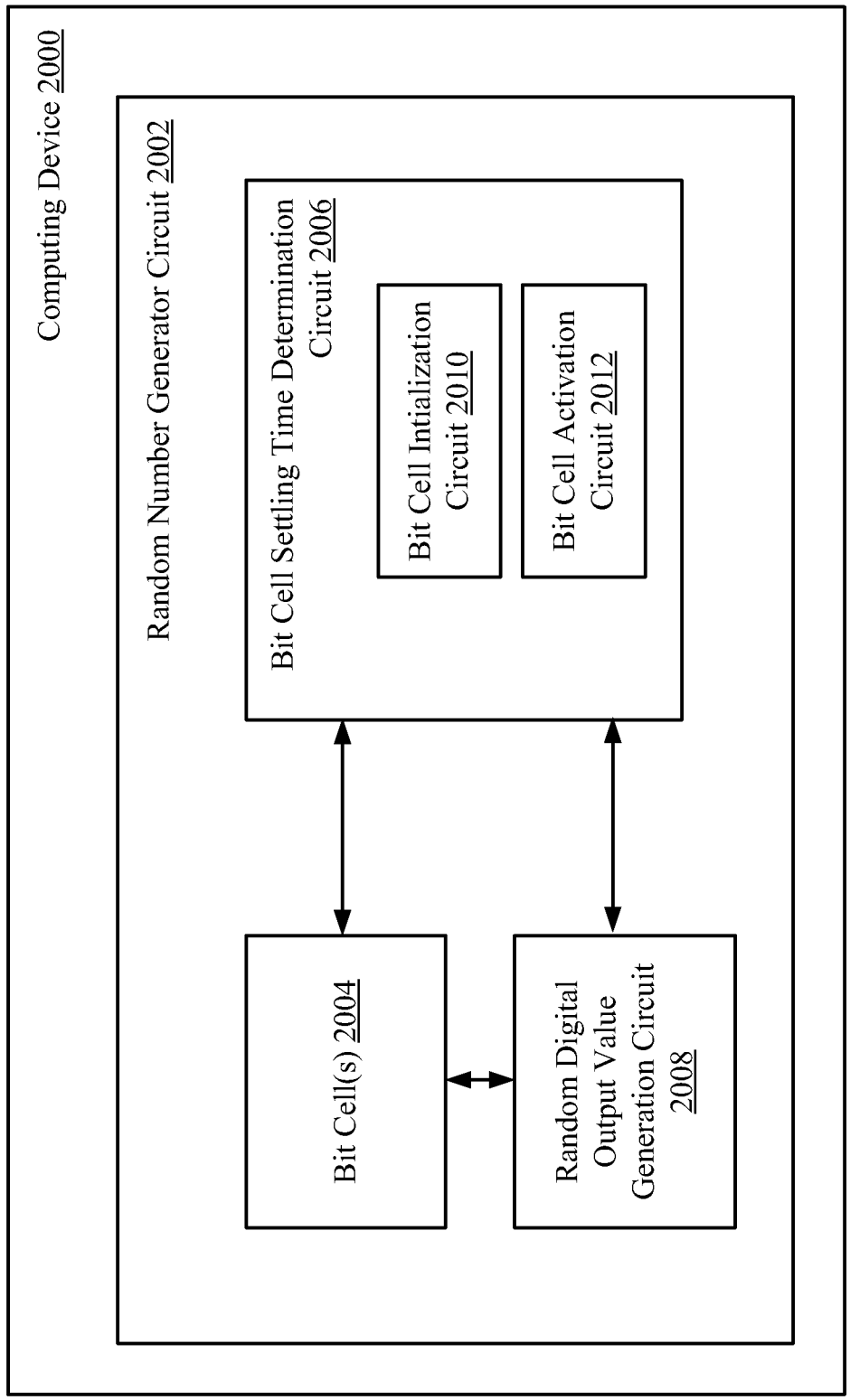
FIG. 20 illustrates a block diagram of a second exemplary computing device.

FIG. 20 illustrates a schematic block diagram of a computing device 2000 according to one aspect of the disclosure. The computing device 2000 may be, for example, a mobile phone, a smartphone, a tablet, a smartwatch, wearable communication glasses that include an optical head-mounted display, a laptop, a desktop computer, a personal digital assistant, and the like. The computing device 2000 includes a random number generator circuit 2002, which may in turn include one or more bit cells 2004, a bit cell settling time determination circuit 2006, and/or a random digital output value generation circuit 2008. According to one aspect, the bit cell settling time determination circuit 2006 may include a bit cell initialization circuit 2010 and/or a bit cell activation circuit 2012.

The bit cells 2004 may be any one of the bit cells described herein. The bit cell settling time determination circuit 2006 is just one example of a means for determining the random settling time of a bit cell. The bit cell settling time determination circuit 2006 may include one or more components, features, and/or steps described with respect to FIGS. 1-18 for determining the random settling time of a bit cell. The random digital output value generation circuit 2008 is just one example of a means for generating a random digital output value based on the random settling time of a bit cell. The random digital output value generation circuit 2008 may include one or more components, features, and/or steps described with respect to FIGS. 1-18 for generating a random digital output value based on the random settling time of a bit cell such as but not limited to an ADC, TDC, and/or one or more flip-flops.

The bit cell initialization circuit 2010 is just one example of a means for initializing a bit cell to cause an output of the bit cell to be at an initialization voltage value. The bit cell initialization circuit 2010 may include one or more components, features, and/or steps described with respect to FIGS. 1-18 for initializing the bit cell to cause the output of the bit cell to be at an initialization voltage value. The bit cell activation circuit 2012 is just one example of a means for activating a bit cell to transition the output of the bit cell from the initialization voltage value to a pre-charge voltage value and then to a settling voltage value. The bit cell activation circuit 2012 may include one or more components, features, and/or steps described with respect to FIGS. 1-18 for activating a bit cell to transition the output of the bit cell from the initialization voltage value to a pre-charge voltage value and then to a settling voltage value.

One or more of the components, steps, features, and/or functions illustrated in FIGS. 1, 2, 3, 4, 5, 6, 7, 8, 9, 10, 11, 12, 13, 14, 15, 16, 17, 18, 19, and 20 may be rearranged and/or combined into a single component, step, feature or function or embodied in several components, steps, or functions. Additional elements, components, steps, and/or functions may also be added without departing from the invention. The apparatus, devices, and/or components illustrated in FIGS. 1, 2, 3, 6, 7, 8, 9, 10, 11, 12, 13, 14, 15, 16, 17, 19, and/or 20 may be configured to perform one or more of the methods, features, or steps described in FIGS. 4, 5, and/or 18. The algorithms described herein may also be efficiently implemented in software and/or embedded in hardware.

Moreover, in one aspect of the disclosure, the random number generator circuit 1906 illustrated in FIG. 19 may be a specialized processor (e.g., an application specific integrated circuit (e.g., ASIC)) that is specifically designed and/or hard-wired to perform the algorithms, methods, and/or steps described in FIG. 18 and the related text. Thus, such a specialized processor (e.g., ASIC) may be one example of a means for executing the algorithms, methods, and/or steps described in FIG. 18. Similarly, the bit cell settling time determination circuit 2006, the bit cell initialization circuit 2010, the bit cell activation circuit 2012, and/or the random digital output value generation circuit 2008 illustrated in FIG. 20 may be specialized processors (e.g., ASICs) that are specifically designed and/or hard-wired to perform the algorithms, methods, and/or steps described in FIG. 18 and the related text.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine-readable mediums and, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing or containing instruction(s) and/or data. Thus, the various methods described herein may be fully or partially implemented by instructions and/or data that may be stored in a "machine-readable medium", "computer-readable medium", and/or "processor-readable medium" and executed by one or more processors, machines and/or devices.

Furthermore, aspects of the disclosure may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A random number generator comprising:
    a plurality of bit cells coupled together such that an output of each of the plurality of bit cells is coupled to an input of a successive bit cell of the plurality of bit cells, each bit cell of the plurality of bit cells having a random settling time; and
    an analog to digital converter (ADC) configured to receive the random settling time of a bit cell of the plurality of bit cells and generate a random digital output value based on the random settling time received.

2. The random number generator of claim 1, wherein each bit cell of the plurality of bit cells includes:
    a six transistor (6T) complimentary metal-oxide semiconductor (CMOS) static random access memory (SRAM) cell portion.

3. The random number generator of claim 1, wherein each bit cell of the plurality of bit cells comprises two pre-charge transistors each having a drain coupled to one of two differential output nodes of the bit cell and a source coupled to a positive supply voltage $V_{DD}$ or a negative supply voltage $V_{ss}$.

4. The random number generator of claim 3, wherein each bit cell of the plurality of bit cells further comprises a pair of cross-coupled inverters each having an input coupled to one of the two differential output nodes.

5. The random number generator of claim 4, wherein the differential output nodes are equal to an initialization voltage value that is approximately the positive supply voltage $V_{DD}$ or the negative supply voltage $V_{ss}$ when the two pre-charge transistors are ON, and the differential output nodes are equal to a pre-charge voltage value $V_{PC}$ that is equal to $0.5*V_{DD} \pm 0.15*V_{DD}$ when the two pre-charge transistors are OFF.

6. The random number generator of claim 4, wherein after the differential output nodes are equal to $V_{PC}$ voltage values of the differential output nodes diverge from one another and settle at opposing settling values.

7. The random number generator of claim 1, wherein a total random settling time is equal to a sum of each of the random settling time of the plurality of bit cells, and the ADC is configured to receive the total random settling time and generate the random digital output value based on the total random settling time.

8. The random number generator of claim 1, wherein the plurality of bit cells are arranged in a ring.

9. The random number generator of claim 8, wherein a periodic random settling time is equal to a sum of each of the random settling time of the plurality of bit cells, and the ADC is configured to receive the periodic random settling time and generate the random digital output value based on the periodic random settling time.

10. The random number generator of claim 9, wherein at least one output of a bit cell of the plurality of bit cells is sampled at a sampling rate to generate a plurality of random digital output values.

11. The random number generator of claim 9, further comprising:
    a flip-flop having an input coupled to an output of a bit cell of the plurality of bit cells, an output of the flip-flop configured to generate a plurality of random digital output values, and the flip-flop having a clock input coupled to an output of a bit cell ring oscillator entropy source.

12. The random number generator of claim 10, further comprising:
    a flip-flop having an input coupled to the output of the bit cell being sampled, the flip-flop having a clock input at the sampling rate and configured to generate the plurality of random digital output values.

13. A method of generating random numbers, the method comprising:
    determining a random settling time of a bit cell of a plurality of bit cells coupled together such that an output of each of the plurality of bit cells is coupled to an input of a successive bit cell of the plurality of bit cells; and
    generating a random digital output value based on the random settling time of the bit cell using an analog to digital converter (ADC).

14. The method of claim 13, wherein determining the random settling time of the bit cell includes:
    initializing the bit cell to cause an output of the bit cell to be at an initialization voltage value; and
    activating the bit cell to transition the output of the bit cell from the initialization voltage value to a pre-charge voltage value and then to a settling voltage value.

15. The method of claim 14, wherein the random settling time of the bit cell is a duration of time elapsed from when the bit cell is activated to when the output of the bit cell reaches the settling voltage value.

16. The method of claim 13, further comprising:
coupling the plurality of bit cells in a ring formation, and each bit cell of the plurality of bit cells has a random settling time.

17. The method of claim 16, wherein a periodic random settling time is equal to a sum of each of the random settling times of the plurality of bit cells, and the method further comprises:
generating the random digital output value based on the periodic random settling time using the ADC.

18. The method of claim 17, further comprising:
sampling at least one output of a bit cell of the plurality of bit cells at a sampling rate to generate a plurality of random digital output values.

19. The method of claim 18, further comprising:
coupling an input of a flip-flop to the output of the bit cell being sampled;
providing a clock signal having the sampling rate to the flip-flop; and
generating the plurality of random digital output values at an output of the flip-flop.

20. The method of claim 17, further comprising:
coupling an input of a flip-flop to an output of a bit cell of the plurality of bit cells;
coupling a clock input of the flip-flop to an output of a bit cell ring oscillator; and
generating a plurality of random digital output values at an output of the flip-flop.

21. A computing device comprising:
a memory circuit; and
a random number generator communicatively coupled to the memory circuit, the random number generator including
a plurality of bit cells coupled together such that an output of each of the plurality of bit cells is coupled to an input of a successive bit cell of the plurality of bit cells, each bit cell of the plurality of bit cells having a random settling time, and
an analog to digital converter (ADC) configured to receive the random settling time of a bit cell of the plurality of bit cells and generate a random digital output value based on the random settling time received, the random digital output value stored at the memory circuit.

22. The computing device of claim 21, wherein each bit cell of the plurality of bit cells includes:
a six transistor (6T) complimentary metal-oxide semiconductor (CMOS) static random access memory (SRAM) cell portion.

23. The computing device of claim 21, wherein each bit cell of the plurality of bit cells comprises two pre-charge transistors each having a drain coupled to one of two differential output nodes of the bit cell and a source coupled to a positive supply voltage $V_{DD}$ or a negative supply voltage $V_{SS}$.

24. The computing device of claim 23, wherein each bit cell of the plurality of bit cells further comprises a pair of cross-coupled inverters each having an input coupled to one of the two differential output nodes.

25. The computing device of claim 21, wherein the plurality of bit cells are arranged in a ring.

26. The computing device of claim 25, wherein a periodic random settling time is equal to a sum of each of the random settling times of the plurality of bit cells, and the ADC is configured to receive the periodic random settling time and generate the random digital output value based on the periodic random settling time.

27. The computing device of claim 26, wherein at least one output of a bit cell of the plurality of bit cells is sampled at a sampling rate to generate a plurality of random digital output values.

28. The computing device of claim 27, wherein the random number generator further includes:
a flip-flop having an input coupled to the output being sampled, the flip-flop having a clock input at the sampling rate and configured to generate the plurality of random digital output values, the plurality of random digital output values stored at the memory circuit.

29. The computing device of claim 26, wherein the random number generator further includes:
a flip-flop having an input coupled to an output of a bit cell of the plurality of bit cells, an output of the flip-flop configured to generate a plurality of random digital output values, the flip-flop having a clock input coupled to an output of a bit cell ring oscillator entropy source, the plurality of random digital output values stored at the memory circuit.

30. A computing device comprising:
means for determining a random settling time of a bit cell of a plurality of bit cells coupled together such that an output of each of the plurality of bit cells is coupled to an input of a successive bit cell of the plurality of bit cells; and
means for generating a random digital output value based on the random settling time of the bit cell.

31. The computing device of claim 30, wherein the means for determining the random settling time of the bit cell includes:
means for initializing the bit cell to cause an output of the bit cell to be at an initialization voltage value; and
means for activating the bit cell to transition the output of the bit cell from the initialization voltage value to a pre-charge voltage value and then to a settling voltage value.

32. The computing device of claim 30, wherein the plurality of bit cells are coupled in a ring formation, and each bit cell of the plurality of bit cells has a random settling time.

33. The computing device of claim 32, wherein a periodic random settling time is equal to a sum of each of the random settling times of the plurality of bit cells, and the computing device further comprises:
means for generating the random digital output value based on the periodic random settling time.

34. The computing device of claim 33, further comprising:
means for sampling at least one output of a bit cell of the plurality of bit cells at a sampling rate to generate a plurality of random digital output values.

35. A random number generator comprising:
a bit cell ring oscillator including a plurality of bit cells arranged in a ring formation, the plurality of bit cells configured to alternate between phases of initialization and activation; and
means for sampling an output node of a bit cell of the plurality of bit cells to generate a plurality of random bits.

36. The random number generator of claim 35, wherein at least one output node of each of the plurality of bit cells of the bit cell ring oscillator are configured to transition from an initialization value to a settling value, a settling value of a preceding bit cell causing the output node of a subsequent bit cell to transition from an initialization value to a settling value.

37. The random number generator of claim 35, wherein at least one output node of each of the plurality of bit cells of the bit cell ring oscillator are configured to transition from a settling value to an initialization value, a settling value of a preceding bit cell causing the output node of a subsequent bit cell to transition from a settling value to an initialization value.

38. The random number generator of claim 35, wherein the bit cell ring oscillator has a random periodic settling time $t_{settle\_period}$ that is based on a settling time $t_{settle}$ of each of the plurality of bit cells, and the plurality of random bits are randomly generated based, in part, on the random periodic settling time $t_{settle\_period}$.

39. The random number generator of claim 35, wherein the means for sampling is a flip-flop having an input communicatively coupled to the output node of the bit cell and an output that generates the plurality of random bits by latching a bit value at the input to the output of the flip-flop, the flip-flop sampling the output node of the bit cell based on a clock signal supplied by a clock to the flip-flop.

40. The random number generator of claim 35, wherein the plurality of bit cells of the bit cell ring oscillator includes a first bit cell and a last bit cell, an output of the last bit cell communicatively coupled to an input of the first bit cell, and inputting a bit value to the input of the first bit cell generates an output bit value at the output of the last bit cell that is opposite the bit value inputted to the input of the first bit cell.

41. The random number generator of claim 35, wherein the random number generator includes 4*n−2 bit cells and n is a positive integer greater than or equal to one (1).

42. The random number generator of claim 35, wherein at least one bit cell of the plurality of bit cells is a p-type bit cell that includes a p-channel metal-oxide-semiconductor field-effect-transistor (PMOS) enable transistor, a cross-coupled inverter pair, and two n-hannel metal-oxide-semiconductor field-effect-transistor (NMOS) pre-charge transistors, the cross-coupled inverter pair having two complimentary output nodes that are communicatively coupled to inputs of at least one of an XOR gate and/or an XNOR gate, and an output of the XOR gate and/or the XNOR gate is the output node of the bit cell sampled by the means for sampling.

43. The random number generator of claim 35, wherein at least one bit cell of the plurality of bit cells is an n-type bit cell that includes an NMOS enable transistor, a cross-coupled inverter pair, and two PMOS pre-charge transistors, the cross-coupled inverter pair having two complimentary output nodes that are communicatively coupled to inputs of at least one of an XOR gate and/or an XNOR gate, and an output of the XOR gate and/or the XNOR gate is the output node of the bit cell sampled by the means for sampling.

44. The random number generator of claim 35, wherein a first bit cell of the plurality of bit cells is a p-type bit cell that includes a PMOS enable transistor, a first cross-coupled inverter pair, and two NMOS pre-charge transistors, the first cross-coupled inverter pair having two complimentary output nodes that are communicatively coupled to inputs of at least one of a first XOR gate and/or a first XNOR gate, a second bit cell of the plurality of bit cells is an n-type bit cell that includes an NMOS enable transistor, a second cross-coupled inverter pair, and two PMOS pre-charge transistors, the second cross-coupled inverter pair having two complimentary output nodes that are communicatively coupled to inputs of at least one of a second XOR gate and/or a second XNOR gate, and an output of the first XOR gate and/or the first XNOR gate is communicatively coupled to a gate of the NMOS enable transistor and gates of the two PMOS pre-charge transistors.

45. The random number generator of claim 44, wherein a delay element delays the output of the first XOR gate and/or the first XNOR gate to the gates of the two PMOS pre-charge transistors relative to the gate of the NMOS enable transistor.

46. The random number generator of claim 35, wherein a first bit cell of the plurality of bit cells is a p-type bit cell that includes a first PMOS enable transistor, a first cross-coupled inverter pair, and two first NMOS pre-charge transistors, the first cross-coupled inverter pair having two complimentary output nodes that are communicatively coupled to inputs of an XOR gate, a second bit cell of the plurality of bit cells is a p-type bit cell that includes a second PMOS enable transistor, a second cross-coupled inverter pair, and two second NMOS pre-charge transistors, the second cross-coupled inverter pair having two complimentary output nodes that are communicatively coupled to inputs of an XNOR gate, and an output of the XOR gate is communicatively coupled to a gate of the second PMOS enable transistor and gates of the two second NMOS pre-charge transistors.

47. The random number generator of claim 35, wherein a first bit cell of the plurality of bit cells is an n-type bit cell that includes a first NMOS enable transistor, a first cross-coupled inverter pair, and two first PMOS pre-charge transistors, the first cross-coupled inverter pair having two complimentary output nodes that are communicatively coupled to inputs of an XOR gate, a second bit cell of the plurality of bit cells is an n-type bit cell that includes a second NMOS enable transistor, a second cross-coupled inverter pair, and two second PMOS pre-charge transistors, the second cross-coupled inverter pair having two complimentary output nodes that are communicatively coupled to inputs of an XNOR gate, and an output of the XOR gate is communicatively coupled to a gate of the second NMOS enable transistor and gates of the two second PMOS pre-charge transistors.

48. The random number generator of claim 35, further comprising:
a plurality of bit cell ring oscillators each including a plurality of bit cells arranged in a ring formation, the plurality of bit cell ring oscillators each having an output that is inputted into a gate stage, the gate stage having a plurality of gates, the gate stage having a gate stage output that is sampled to generate the plurality of random bits.

* * * * *